(12) United States Patent  (10) Patent No.: US 9,287,607 B2
Efe et al.  (45) Date of Patent: Mar. 15, 2016

(54) RESONATOR FINE TUNING

(75) Inventors: Volkan Efe, Watertown, MA (US);
Katherine L. Hall, Westford, MA (US);
Alexander Patrick McCauley, Cambridge, MA (US); Morris P. Kesler, Bedford, MA (US)

(73) Assignee: WiTricity Corporation, Watertown, MA (US)

( * ) Notice: Subject to any disclaimer, the term of this patent is extended or adjusted under 35 U.S.C. 154(b) by 162 days.

(21) Appl. No.: 13/562,528

(22) Filed: Jul. 31, 2012

(65) Prior Publication Data

US 2014/0035704 A1    Feb. 6, 2014

(51) Int. Cl.
*H01P 7/00*  (2006.01)
*H01F 38/14*  (2006.01)
*H03H 7/40*  (2006.01)

(52) U.S. Cl.
CPC *H01P 7/00* (2013.01); *H01F 38/14* (2013.01); *H03H 7/40* (2013.01)

(58) Field of Classification Search
CPC . H01P 7/082; H01P 1/20372; H01P 1/20381; H03H 7/40; H03H 7/38; H01F 38/14; H01F 29/06; H01F 29/08; H01F 29/10; H01F 21/02; H01F 21/10
USPC .............. 333/205, 235, 32–34, 17.1, 17.3; 336/30, 40
See application file for complete search history.

(56) References Cited

U.S. PATENT DOCUMENTS

| | | |
|---|---|---|
| 645,576 A | 3/1900 | Tesla |
| 649,621 A | 5/1900 | Tesla |
| 787,412 A | 4/1905 | Tesla |
| 1,119,732 A | 12/1914 | Tesla |
| 2,133,494 A | 10/1938 | Waters |
| 3,517,350 A | 6/1970 | Beaver |
| 3,535,543 A | 10/1970 | Dailey |
| 3,780,425 A | 12/1973 | Penn et al. |
| 3,871,176 A | 3/1975 | Schukei |
| 4,088,999 A | 5/1978 | Fletcher et al. |
| 4,095,998 A | 6/1978 | Hanson |
| 4,180,795 A | 12/1979 | Matsuda et al. |
| 4,280,129 A | 7/1981 | Wells |
| 4,450,431 A | 5/1984 | Hochstein |
| 4,588,978 A | 5/1986 | Allen |
| 5,027,709 A | 7/1991 | Slagle |
| 5,033,295 A | 7/1991 | Schmid et al. |
| 5,034,658 A | 7/1991 | Hierig et al. |

(Continued)

FOREIGN PATENT DOCUMENTS

| | | |
|---|---|---|
| CA | 142352 | 8/1912 |
| CN | 102239633 | 11/2011 |

(Continued)

OTHER PUBLICATIONS

Extended European Search Report for 11184066.6 mailed Mar. 28, 2013, Massachusetts Institute of Technology, 7 pages.

(Continued)

*Primary Examiner* — Robert Pascal
*Assistant Examiner* — Gerald Stevens
(74) *Attorney, Agent, or Firm* — Fish & Richardson P.C.

(57) ABSTRACT

A tunable resonator assembly includes a resonator coil having an inductance, and a tile residing at a position relative to the resonator coil the position selected to produce a desired change in the inductance of the resonator coil.

20 Claims, 7 Drawing Sheets

(56) References Cited

U.S. PATENT DOCUMENTS

| | | | |
|---|---|---|---|
| 5,053,774 | A | 10/1991 | Schuermann et al. |
| 5,070,293 | A | 12/1991 | Ishii et al. |
| 5,118,997 | A | 6/1992 | El-Hamamsy |
| 5,216,402 | A | 6/1993 | Carosa |
| 5,229,652 | A | 7/1993 | Hough |
| 5,287,112 | A | 2/1994 | Schuermann |
| 5,341,083 | A | 8/1994 | Klontz et al. |
| 5,367,242 | A | 11/1994 | Hulman |
| 5,374,930 | A | 12/1994 | Schuermann |
| 5,408,209 | A | 4/1995 | Tanzer et al. |
| 5,437,057 | A | 7/1995 | Richley et al. |
| 5,455,467 | A | 10/1995 | Young et al. |
| 5,493,691 | A | 2/1996 | Barrett |
| 5,522,856 | A | 6/1996 | Reineman |
| 5,528,113 | A | 6/1996 | Boys et al. |
| 5,541,604 | A | 7/1996 | Meier |
| 5,550,452 | A | 8/1996 | Shirai et al. |
| 5,565,763 | A | 10/1996 | Arrendale et al. |
| 5,630,835 | A | 5/1997 | Brownlee |
| 5,697,956 | A | 12/1997 | Bornzin |
| 5,703,461 | A | 12/1997 | Minoshima et al. |
| 5,703,573 | A | 12/1997 | Fujimoto et al. |
| 5,710,413 | A | 1/1998 | King et al. |
| 5,742,471 | A | 4/1998 | Barbee, Jr. et al. |
| 5,821,728 | A | 10/1998 | Schwind |
| 5,821,731 | A | 10/1998 | Kuki et al. |
| 5,864,323 | A | 1/1999 | Berthon |
| 5,898,579 | A | 4/1999 | Boys et al. |
| 5,903,134 | A | 5/1999 | Takeuchi |
| 5,923,544 | A | 7/1999 | Urano |
| 5,940,509 | A | 8/1999 | Jovanovich et al. |
| 5,957,956 | A | 9/1999 | Kroll et al. |
| 5,959,245 | A | 9/1999 | Moe et al. |
| 5,968,876 | A * | 10/1999 | Sochor ............ 505/210 |
| 5,986,895 | A | 11/1999 | Stewart et al. |
| 5,993,996 | A | 11/1999 | Firsich |
| 5,999,308 | A | 12/1999 | Nelson et al. |
| 6,012,659 | A | 1/2000 | Nakazawa et al. |
| 6,047,214 | A | 4/2000 | Mueller et al. |
| 6,057,668 | A | 5/2000 | Chao |
| 6,066,163 | A | 5/2000 | John |
| 6,067,473 | A | 5/2000 | Greeninger et al. |
| 6,108,579 | A | 8/2000 | Snell et al. |
| 6,127,799 | A | 10/2000 | Krishnan |
| 6,130,189 | A * | 10/2000 | Matthaei ............ 505/210 |
| 6,176,433 | B1 | 1/2001 | Uesaka et al. |
| 6,184,651 | B1 | 2/2001 | Fernandez et al. |
| 6,207,887 | B1 | 3/2001 | Bass et al. |
| 6,232,841 | B1 | 5/2001 | Bartlett et al. |
| 6,238,387 | B1 | 5/2001 | Miller, III |
| 6,252,762 | B1 | 6/2001 | Amatucci |
| 6,356,773 | B1 | 3/2002 | Rinot |
| 6,406,168 | B1 | 6/2002 | Whiting |
| 6,436,299 | B1 | 8/2002 | Baarman et al. |
| 6,450,946 | B1 | 9/2002 | Forsell |
| 6,452,465 | B1 | 9/2002 | Brown et al. |
| 6,459,218 | B2 | 10/2002 | Boys et al. |
| 6,473,028 | B1 | 10/2002 | Luc |
| 6,483,202 | B1 | 11/2002 | Boys |
| 6,515,878 | B1 | 2/2003 | Meins et al. |
| 6,535,133 | B2 | 3/2003 | Gohara |
| 6,561,975 | B1 | 5/2003 | Pool et al. |
| 6,563,425 | B2 | 5/2003 | Nicholson et al. |
| 6,597,076 | B2 | 7/2003 | Scheible et al. |
| 6,609,023 | B1 | 8/2003 | Fischell et al. |
| 6,631,072 | B1 | 10/2003 | Paul et al. |
| 6,650,227 | B1 | 11/2003 | Bradin |
| 6,664,770 | B1 | 12/2003 | Bartels |
| 6,673,250 | B2 | 1/2004 | Kuennen et al. |
| 6,683,256 | B2 | 1/2004 | Kao |
| 6,696,647 | B2 | 2/2004 | Ono et al. |
| 6,703,921 | B1 | 3/2004 | Wuidart et al. |
| 6,731,071 | B2 | 5/2004 | Baarman |
| 6,749,119 | B2 | 6/2004 | Scheible et al. |
| 6,772,011 | B2 | 8/2004 | Dolgin |
| 6,798,716 | B1 | 9/2004 | Charych |
| 6,803,744 | B1 | 10/2004 | Sabo |
| 6,806,649 | B2 | 10/2004 | Mollema et al. |
| 6,812,645 | B2 | 11/2004 | Baarman |
| 6,825,620 | B2 | 11/2004 | Kuennen et al. |
| 6,831,417 | B2 | 12/2004 | Baarman |
| 6,839,035 | B1 | 1/2005 | Addonisio et al. |
| 6,844,702 | B2 | 1/2005 | Giannopoulos et al. |
| 6,856,291 | B2 | 2/2005 | Mickle et al. |
| 6,858,970 | B2 | 2/2005 | Malkin et al. |
| 6,906,495 | B2 | 6/2005 | Cheng et al. |
| 6,917,163 | B2 | 7/2005 | Baarman |
| 6,917,431 | B2 | 7/2005 | Soljacic et al. |
| 6,937,130 | B2 | 8/2005 | Scheible et al. |
| 6,960,968 | B2 | 11/2005 | Odendaal et al. |
| 6,961,619 | B2 | 11/2005 | Casey |
| 6,967,462 | B1 | 11/2005 | Landis |
| 6,975,198 | B2 | 12/2005 | Baarman et al. |
| 6,988,026 | B2 | 1/2006 | Breed et al. |
| 7,027,311 | B2 | 4/2006 | Vanderelli et al. |
| 7,035,076 | B1 | 4/2006 | Stevenson |
| 7,042,196 | B2 | 5/2006 | Ka-Lai et al. |
| 7,069,064 | B2 | 6/2006 | Gevorgian et al. |
| 7,076,206 | B2 | 7/2006 | Elferich et al. |
| 7,084,605 | B2 | 8/2006 | Mickle et al. |
| 7,116,200 | B2 | 10/2006 | Baarman et al. |
| 7,118,240 | B2 | 10/2006 | Baarman et al. |
| 7,126,450 | B2 | 10/2006 | Baarman et al. |
| 7,127,293 | B2 | 10/2006 | MacDonald |
| 7,132,918 | B2 | 11/2006 | Baarman et al. |
| 7,147,604 | B1 | 12/2006 | Allen et al. |
| 7,180,248 | B2 | 2/2007 | Kuennen et al. |
| 7,191,007 | B2 | 3/2007 | Desai et al. |
| 7,193,418 | B2 | 3/2007 | Freytag |
| D541,322 | S | 4/2007 | Garrett et al. |
| 7,212,414 | B2 | 5/2007 | Baarman |
| 7,221,966 | B2 | 5/2007 | Birli et al. |
| 7,233,137 | B2 | 6/2007 | Nakamura et al. |
| D545,855 | S | 7/2007 | Garrett et al. |
| 7,239,110 | B2 | 7/2007 | Cheng et al. |
| 7,248,017 | B2 | 7/2007 | Cheng et al. |
| 7,251,527 | B2 | 7/2007 | Lyden |
| 7,288,918 | B2 | 10/2007 | DiStefano |
| 7,340,304 | B2 | 3/2008 | MacDonald |
| 7,375,492 | B2 | 5/2008 | Calhoon et al. |
| 7,375,493 | B2 | 5/2008 | Calhoon et al. |
| 7,378,817 | B2 | 5/2008 | Calhoon et al. |
| 7,382,636 | B2 | 6/2008 | Baarman et al. |
| 7,385,357 | B2 | 6/2008 | Kuennen et al. |
| 7,443,135 | B2 | 10/2008 | Cho |
| 7,462,951 | B1 | 12/2008 | Baarman |
| 7,466,213 | B2 | 12/2008 | Löbl et al. |
| 7,471,062 | B2 | 12/2008 | Bruning |
| 7,474,058 | B2 | 1/2009 | Baarman |
| 7,492,247 | B2 | 2/2009 | Schmidt et al. |
| 7,514,818 | B2 | 4/2009 | Abe et al. |
| 7,518,267 | B2 | 4/2009 | Baarman |
| 7,521,890 | B2 | 4/2009 | Lee et al. |
| 7,525,283 | B2 | 4/2009 | Cheng et al. |
| 7,545,337 | B2 | 6/2009 | Guenther |
| 7,554,316 | B2 | 6/2009 | Stevens et al. |
| 7,599,743 | B2 | 10/2009 | Hassler, Jr. et al. |
| 7,615,936 | B2 | 11/2009 | Baarman et al. |
| 7,639,514 | B2 | 12/2009 | Baarman |
| 7,741,734 | B2 | 6/2010 | Joannopoulos et al. |
| 7,795,708 | B2 | 9/2010 | Katti |
| 7,825,543 | B2 | 11/2010 | Karalis et al. |
| 7,825,544 | B2 | 11/2010 | Jansen et al. |
| 7,835,417 | B2 | 11/2010 | Heideman et al. |
| 7,843,288 | B2 | 11/2010 | Lee et al. |
| 7,844,306 | B2 | 11/2010 | Shearer et al. |
| 7,863,859 | B2 | 1/2011 | Soar |
| 7,880,337 | B2 | 2/2011 | Farkas |
| 7,884,697 | B2 | 2/2011 | Wei et al. |
| 7,885,050 | B2 | 2/2011 | Lee |
| 7,919,886 | B2 | 4/2011 | Tanaka |
| 7,923,870 | B2 | 4/2011 | Jin |
| 7,932,798 | B2 | 4/2011 | Tolle et al. |
| 7,948,209 | B2 | 5/2011 | Jung |

(56) References Cited

U.S. PATENT DOCUMENTS

| | | |
|---|---|---|
| 7,952,322 B2 | 5/2011 | Partovi et al. |
| 7,963,941 B2 | 6/2011 | Wilk |
| 7,969,045 B2 | 6/2011 | Schmidt et al. |
| 7,994,880 B2 | 8/2011 | Chen et al. |
| 7,999,506 B1 | 8/2011 | Hollar et al. |
| 8,022,576 B2 | 9/2011 | Joannopoulos et al. |
| 8,035,255 B2 | 10/2011 | Kurs et al. |
| 8,076,800 B2 | 12/2011 | Joannopoulos et al. |
| 8,076,801 B2 | 12/2011 | Karalis et al. |
| 8,084,889 B2 | 12/2011 | Joannopoulos et al. |
| 8,097,983 B2 | 1/2012 | Karalis et al. |
| 8,106,539 B2 | 1/2012 | Schatz et al. |
| 8,115,448 B2 | 2/2012 | John |
| 8,131,378 B2 | 3/2012 | Greenberg et al. |
| 8,178,995 B2 | 5/2012 | Amano et al. |
| 8,193,769 B2 | 6/2012 | Azancot et al. |
| 8,212,414 B2 | 7/2012 | Howard et al. |
| 8,260,200 B2 | 9/2012 | Shimizu et al. |
| 8,304,935 B2 | 11/2012 | Karalis et al. |
| 8,324,759 B2 | 12/2012 | Karalis et al. |
| 8,334,620 B2 | 12/2012 | Park et al. |
| 8,362,651 B2 | 1/2013 | Hamam et al. |
| 8,395,282 B2 | 3/2013 | Joannopoulos et al. |
| 8,395,283 B2 | 3/2013 | Joannopoulos et al. |
| 8,400,017 B2 | 3/2013 | Kurs et al. |
| 8,400,018 B2 | 3/2013 | Joannopoulos et al. |
| 8,400,019 B2 | 3/2013 | Joannopoulos et al. |
| 8,400,020 B2 | 3/2013 | Joannopoulos et al. |
| 8,400,021 B2 | 3/2013 | Joannopoulos et al. |
| 8,400,022 B2 | 3/2013 | Joannopoulos et al. |
| 8,400,023 B2 | 3/2013 | Joannopoulos et al. |
| 8,400,024 B2 | 3/2013 | Joannopoulos et al. |
| 8,410,636 B2 | 4/2013 | Kurs et al. |
| 8,441,154 B2 | 5/2013 | Karalis et al. |
| 8,457,547 B2 | 6/2013 | Meskens |
| 8,461,719 B2 | 6/2013 | Kesler et al. |
| 8,461,720 B2 | 6/2013 | Kurs et al. |
| 8,461,721 B2 | 6/2013 | Karalis et al. |
| 8,461,722 B2 | 6/2013 | Kurs et al. |
| 8,461,817 B2 | 6/2013 | Martin et al. |
| 8,466,583 B2 | 6/2013 | Karalis et al. |
| 8,471,410 B2 | 6/2013 | Karalis et al. |
| 8,476,788 B2 | 7/2013 | Karalis et al. |
| 8,482,157 B2 | 7/2013 | Cook et al. |
| 8,482,158 B2 | 7/2013 | Kurs et al. |
| 8,487,480 B1 | 7/2013 | Kesler et al. |
| 8,497,601 B2 | 7/2013 | Hall et al. |
| 8,552,592 B2 | 10/2013 | Schatz et al. |
| 8,569,914 B2 | 10/2013 | Karalis et al. |
| 8,587,153 B2 | 11/2013 | Schatz et al. |
| 8,587,155 B2 | 11/2013 | Giler et al. |
| 8,598,743 B2 | 12/2013 | Hall et al. |
| 8,618,696 B2 | 12/2013 | Karalis et al. |
| 8,629,578 B2 | 1/2014 | Kurs et al. |
| 8,643,326 B2 | 2/2014 | Campanella et al. |
| 2002/0032471 A1 | 3/2002 | Loftin et al. |
| 2002/0105343 A1 | 8/2002 | Scheible et al. |
| 2002/0118004 A1 | 8/2002 | Scheible et al. |
| 2002/0130642 A1 | 9/2002 | Ettes et al. |
| 2002/0167294 A1 | 11/2002 | Odaohhara |
| 2003/0038641 A1 | 2/2003 | Scheible |
| 2003/0062794 A1 | 4/2003 | Scheible et al. |
| 2003/0062980 A1 | 4/2003 | Scheible et al. |
| 2003/0071034 A1 | 4/2003 | Thompson et al. |
| 2003/0124050 A1 | 7/2003 | Yadav et al. |
| 2003/0126948 A1 | 7/2003 | Yadav et al. |
| 2003/0160590 A1 | 8/2003 | Schaefer et al. |
| 2003/0199778 A1 | 10/2003 | Mickle et al. |
| 2003/0214255 A1 | 11/2003 | Baarman et al. |
| 2004/0000974 A1 | 1/2004 | Odenaal et al. |
| 2004/0026998 A1 | 2/2004 | Henriott et al. |
| 2004/0100338 A1 | 5/2004 | Clark |
| 2004/0113847 A1 | 6/2004 | Qi et al. |
| 2004/0130425 A1 | 7/2004 | Dayan et al. |
| 2004/0130915 A1 | 7/2004 | Baarman |
| 2004/0130916 A1 | 7/2004 | Baarman |
| 2004/0142733 A1 | 7/2004 | Parise |
| 2004/0150934 A1 | 8/2004 | Baarman |
| 2004/0189246 A1 | 9/2004 | Bulai et al. |
| 2004/0201361 A1 | 10/2004 | Koh et al. |
| 2004/0222751 A1 | 11/2004 | Mollema et al. |
| 2004/0227057 A1 | 11/2004 | Tuominen et al. |
| 2004/0232845 A1 | 11/2004 | Baarman et al. |
| 2004/0233043 A1 | 11/2004 | Yazawa et al. |
| 2004/0267501 A1 | 12/2004 | Freed et al. |
| 2005/0007067 A1 | 1/2005 | Baarman et al. |
| 2005/0021134 A1 | 1/2005 | Opie |
| 2005/0027192 A1 | 2/2005 | Govari et al. |
| 2005/0033382 A1 | 2/2005 | Single |
| 2005/0085873 A1 | 4/2005 | Gord et al. |
| 2005/0093475 A1 | 5/2005 | Kuennen et al. |
| 2005/0104064 A1 | 5/2005 | Hegarty et al. |
| 2005/0104453 A1 | 5/2005 | Vanderelli et al. |
| 2005/0116650 A1 | 6/2005 | Baarman |
| 2005/0116683 A1 | 6/2005 | Cheng et al. |
| 2005/0122058 A1 | 6/2005 | Baarman et al. |
| 2005/0122059 A1 | 6/2005 | Baarman et al. |
| 2005/0125093 A1 | 6/2005 | Kikuchi et al. |
| 2005/0127849 A1 | 6/2005 | Baarman et al. |
| 2005/0127850 A1 | 6/2005 | Baarman et al. |
| 2005/0127866 A1 | 6/2005 | Hamilton et al. |
| 2005/0135122 A1 | 6/2005 | Cheng et al. |
| 2005/0140482 A1 | 6/2005 | Cheng et al. |
| 2005/0151511 A1 | 7/2005 | Chary |
| 2005/0156560 A1 | 7/2005 | Shimaoka et al. |
| 2005/0189945 A1 | 9/2005 | Reiderman |
| 2005/0194926 A1 | 9/2005 | Di Stefano |
| 2005/0253152 A1 | 11/2005 | Klimov et al. |
| 2005/0288739 A1 | 12/2005 | Hassler, Jr. et al. |
| 2005/0288740 A1 | 12/2005 | Hassler, Jr. et al. |
| 2005/0288741 A1 | 12/2005 | Hassler, Jr. et al. |
| 2005/0288742 A1 | 12/2005 | Giordano et al. |
| 2006/0001509 A1 | 1/2006 | Gibbs |
| 2006/0010902 A1 | 1/2006 | Trinh et al. |
| 2006/0022636 A1 | 2/2006 | Xian et al. |
| 2006/0053296 A1 | 3/2006 | Busboom et al. |
| 2006/0061323 A1 | 3/2006 | Cheng et al. |
| 2006/0066443 A1 | 3/2006 | Hall |
| 2006/0090956 A1 | 5/2006 | Peshkovskiy et al. |
| 2006/0132045 A1 | 6/2006 | Baarman |
| 2006/0164866 A1 | 7/2006 | Vanderelli et al. |
| 2006/0181242 A1 | 8/2006 | Freed et al. |
| 2006/0184209 A1 | 8/2006 | John et al. |
| 2006/0184210 A1 | 8/2006 | Singhal et al. |
| 2006/0185809 A1 | 8/2006 | Elfrink et al. |
| 2006/0199620 A1 | 9/2006 | Greene et al. |
| 2006/0202665 A1 | 9/2006 | Hsu |
| 2006/0205381 A1 | 9/2006 | Beart et al. |
| 2006/0214626 A1 | 9/2006 | Nilson et al. |
| 2006/0219448 A1 | 10/2006 | Grieve et al. |
| 2006/0238365 A1 | 10/2006 | Vecchione et al. |
| 2006/0270440 A1 | 11/2006 | Shearer et al. |
| 2006/0277666 A1 | 12/2006 | Gertsch et al. |
| 2006/0281435 A1 | 12/2006 | Shearer et al. |
| 2007/0010295 A1 | 1/2007 | Greene et al. |
| 2007/0013483 A1 | 1/2007 | Stewart |
| 2007/0016089 A1 | 1/2007 | Fischell et al. |
| 2007/0021140 A1 | 1/2007 | Keyes, IV et al. |
| 2007/0024246 A1 | 2/2007 | Flaugher |
| 2007/0064406 A1 | 3/2007 | Beart |
| 2007/0069687 A1 | 3/2007 | Suzuki |
| 2007/0096875 A1 | 5/2007 | Waterhouse et al. |
| 2007/0105429 A1 | 5/2007 | Kohl et al. |
| 2007/0117596 A1 | 5/2007 | Greene et al. |
| 2007/0126650 A1 | 6/2007 | Guenther |
| 2007/0145830 A1 | 6/2007 | Lee et al. |
| 2007/0164839 A1 | 7/2007 | Naito |
| 2007/0171681 A1 | 7/2007 | Baarman |
| 2007/0176840 A1 | 8/2007 | Pristas et al. |
| 2007/0178945 A1 | 8/2007 | Cook et al. |
| 2007/0182367 A1 | 8/2007 | Partovi |
| 2007/0208263 A1 | 9/2007 | John et al. |
| 2007/0222542 A1 | 9/2007 | Joannopoulos et al. |
| 2007/0257636 A1 | 11/2007 | Phillips et al. |

(56) References Cited

U.S. PATENT DOCUMENTS

| | | |
|---|---|---|
| 2007/0267918 A1 | 11/2007 | Gyland |
| 2007/0276538 A1 | 11/2007 | Kjellsson et al. |
| 2008/0012569 A1 | 1/2008 | Hall et al. |
| 2008/0014897 A1 | 1/2008 | Cook et al. |
| 2008/0030415 A1 | 2/2008 | Homan et al. |
| 2008/0036588 A1 | 2/2008 | Iverson et al. |
| 2008/0047727 A1 | 2/2008 | Sexton et al. |
| 2008/0051854 A1 | 2/2008 | Bulkes et al. |
| 2008/0067874 A1 | 3/2008 | Tseng |
| 2008/0132909 A1 | 6/2008 | Jascob et al. |
| 2008/0154331 A1 | 6/2008 | John et al. |
| 2008/0176521 A1 | 7/2008 | Singh et al. |
| 2008/0191638 A1 | 8/2008 | Kuennen et al. |
| 2008/0197710 A1 | 8/2008 | Kreitz et al. |
| 2008/0197802 A1 | 8/2008 | Onishi et al. |
| 2008/0211320 A1 | 9/2008 | Cook et al. |
| 2008/0238364 A1 | 10/2008 | Weber et al. |
| 2008/0255901 A1 | 10/2008 | Carroll et al. |
| 2008/0265684 A1 | 10/2008 | Farkas |
| 2008/0266748 A1 | 10/2008 | Lee |
| 2008/0272860 A1 | 11/2008 | Pance |
| 2008/0273242 A1 | 11/2008 | Woodgate et al. |
| 2008/0278264 A1 | 11/2008 | Karalis et al. |
| 2008/0291277 A1 | 11/2008 | Jacobsen et al. |
| 2008/0300657 A1 | 12/2008 | Stultz |
| 2008/0300660 A1 | 12/2008 | John |
| 2009/0010028 A1 | 1/2009 | Baarman et al. |
| 2009/0015075 A1 | 1/2009 | Cook et al. |
| 2009/0033280 A1 | 2/2009 | Choi et al. |
| 2009/0033564 A1 | 2/2009 | Cook et al. |
| 2009/0038623 A1 | 2/2009 | Farbarik et al. |
| 2009/0045772 A1 | 2/2009 | Cook et al. |
| 2009/0051224 A1 | 2/2009 | Cook et al. |
| 2009/0058189 A1 | 3/2009 | Cook |
| 2009/0058361 A1 | 3/2009 | John |
| 2009/0067198 A1 | 3/2009 | Graham et al. |
| 2009/0072627 A1 | 3/2009 | Cook et al. |
| 2009/0072628 A1 | 3/2009 | Cook et al. |
| 2009/0072629 A1 | 3/2009 | Cook |
| 2009/0072782 A1 | 3/2009 | Randall |
| 2009/0079268 A1 | 3/2009 | Cook et al. |
| 2009/0079387 A1 | 3/2009 | Jin et al. |
| 2009/0085408 A1 | 4/2009 | Bruhn |
| 2009/0085706 A1 | 4/2009 | Baarman et al. |
| 2009/0096413 A1 | 4/2009 | Partovi et al. |
| 2009/0102292 A1 | 4/2009 | Cook et al. |
| 2009/0108679 A1 | 4/2009 | Porwal |
| 2009/0108997 A1 | 4/2009 | Petterson et al. |
| 2009/0115628 A1 | 5/2009 | Dicks et al. |
| 2009/0127937 A1 | 5/2009 | Widmer et al. |
| 2009/0134712 A1 | 5/2009 | Cook et al. |
| 2009/0146892 A1 | 6/2009 | Shimizu et al. |
| 2009/0153273 A1 | 6/2009 | Chen et al. |
| 2009/0160261 A1 | 6/2009 | Elo |
| 2009/0161078 A1 | 6/2009 | Wu et al. |
| 2009/0167449 A1 | 7/2009 | Cook et al. |
| 2009/0174263 A1 | 7/2009 | Baarman et al. |
| 2009/0179502 A1 | 7/2009 | Cook et al. |
| 2009/0188396 A1 | 7/2009 | Hofmann et al. |
| 2009/0189458 A1 | 7/2009 | Kawasaki |
| 2009/0195332 A1 | 8/2009 | Joannopoulos et al. |
| 2009/0195333 A1 | 8/2009 | Joannopoulos et al. |
| 2009/0212636 A1 | 8/2009 | Cook et al. |
| 2009/0213028 A1 | 8/2009 | Cook et al. |
| 2009/0218884 A1 | 9/2009 | Soar |
| 2009/0224608 A1 | 9/2009 | Cook et al. |
| 2009/0224609 A1 | 9/2009 | Cook et al. |
| 2009/0224723 A1 | 9/2009 | Tanabe |
| 2009/0224856 A1 | 9/2009 | Karalis et al. |
| 2009/0230777 A1 | 9/2009 | Baarman et al. |
| 2009/0237194 A1 | 9/2009 | Waffenschmidt et al. |
| 2009/0243394 A1 | 10/2009 | Levine |
| 2009/0243397 A1 | 10/2009 | Cook et al. |
| 2009/0251008 A1 | 10/2009 | Sugaya |
| 2009/0261778 A1 | 10/2009 | Kook |
| 2009/0267558 A1 | 10/2009 | Jung |
| 2009/0267709 A1 | 10/2009 | Joannopoulos et al. |
| 2009/0267710 A1 | 10/2009 | Joannopoulos et al. |
| 2009/0271047 A1 | 10/2009 | Wakamatsu |
| 2009/0271048 A1 | 10/2009 | Wakamatsu |
| 2009/0273242 A1 | 11/2009 | Cook |
| 2009/0273318 A1 | 11/2009 | Rondoni et al. |
| 2009/0281678 A1 | 11/2009 | Wakamatsu |
| 2009/0284082 A1 | 11/2009 | Mohammadian |
| 2009/0284083 A1 | 11/2009 | Karalis et al. |
| 2009/0284218 A1 | 11/2009 | Mohammadian et al. |
| 2009/0284220 A1 | 11/2009 | Toncich et al. |
| 2009/0284227 A1 | 11/2009 | Mohammadian et al. |
| 2009/0284245 A1 | 11/2009 | Kirby et al. |
| 2009/0284369 A1 | 11/2009 | Toncich et al. |
| 2009/0286470 A1 | 11/2009 | Mohammadian et al. |
| 2009/0286475 A1 | 11/2009 | Toncich et al. |
| 2009/0286476 A1 | 11/2009 | Toncich et al. |
| 2009/0289595 A1 | 11/2009 | Chen et al. |
| 2009/0299918 A1 | 12/2009 | Cook et al. |
| 2009/0308933 A1 | 12/2009 | Osada |
| 2009/0322158 A1 | 12/2009 | Stevens et al. |
| 2009/0322280 A1 | 12/2009 | Kamijo et al. |
| 2010/0015918 A1 | 1/2010 | Liu et al. |
| 2010/0017249 A1 | 1/2010 | Fincham et al. |
| 2010/0033021 A1 | 2/2010 | Bennett |
| 2010/0034238 A1 | 2/2010 | Bennett |
| 2010/0036773 A1 | 2/2010 | Bennett |
| 2010/0038970 A1 | 2/2010 | Cook et al. |
| 2010/0045114 A1 | 2/2010 | Sample et al. |
| 2010/0052431 A1 | 3/2010 | Mita |
| 2010/0052811 A1 | 3/2010 | Smith et al. |
| 2010/0060077 A1 | 3/2010 | Paulus et al. |
| 2010/0065352 A1 | 3/2010 | Ichikawa |
| 2010/0066349 A1 | 3/2010 | Lin et al. |
| 2010/0073107 A1* | 3/2010 | Prophet et al. ............... 333/204 |
| 2010/0076524 A1 | 3/2010 | Forsberg et al. |
| 2010/0081379 A1 | 4/2010 | Cooper et al. |
| 2010/0094381 A1 | 4/2010 | Kim et al. |
| 2010/0096934 A1 | 4/2010 | Joannopoulos et al. |
| 2010/0100997 A1 | 4/2010 | Lee et al. |
| 2010/0102639 A1 | 4/2010 | Joannopoulos et al. |
| 2010/0102640 A1 | 4/2010 | Joannopoulos et al. |
| 2010/0102641 A1 | 4/2010 | Joannopoulos et al. |
| 2010/0104031 A1 | 4/2010 | Lacour |
| 2010/0109443 A1 | 5/2010 | Cook et al. |
| 2010/0109445 A1 | 5/2010 | Kurs et al. |
| 2010/0109604 A1 | 5/2010 | Boys et al. |
| 2010/0115474 A1 | 5/2010 | Takada et al. |
| 2010/0117454 A1 | 5/2010 | Cook et al. |
| 2010/0117455 A1 | 5/2010 | Joannopoulos et al. |
| 2010/0117456 A1 | 5/2010 | Karalis et al. |
| 2010/0117596 A1 | 5/2010 | Cook et al. |
| 2010/0123353 A1 | 5/2010 | Joannopoulos et al. |
| 2010/0123354 A1 | 5/2010 | Joannopoulos et al. |
| 2010/0123355 A1 | 5/2010 | Joannopoulos et al. |
| 2010/0123452 A1 | 5/2010 | Amano et al. |
| 2010/0123530 A1 | 5/2010 | Park et al. |
| 2010/0127573 A1 | 5/2010 | Joannopoulos et al. |
| 2010/0127574 A1 | 5/2010 | Joannopoulos et al. |
| 2010/0127575 A1 | 5/2010 | Joannopoulos et al. |
| 2010/0127660 A1 | 5/2010 | Cook et al. |
| 2010/0133918 A1 | 6/2010 | Joannopoulos et al. |
| 2010/0133919 A1 | 6/2010 | Joannopoulos et al. |
| 2010/0133920 A1 | 6/2010 | Joannopoulos et al. |
| 2010/0141042 A1 | 6/2010 | Kesler et al. |
| 2010/0148589 A1 | 6/2010 | Hamam et al. |
| 2010/0148723 A1 | 6/2010 | Cook et al. |
| 2010/0151808 A1 | 6/2010 | Toncich et al. |
| 2010/0156346 A1 | 6/2010 | Takada et al. |
| 2010/0156355 A1 | 6/2010 | Bauerle et al. |
| 2010/0156570 A1 | 6/2010 | Hong et al. |
| 2010/0164295 A1 | 7/2010 | Ichikawa et al. |
| 2010/0164296 A1 | 7/2010 | Kurs |
| 2010/0164297 A1 | 7/2010 | Kurs et al. |
| 2010/0164298 A1 | 7/2010 | Karalis et al. |
| 2010/0171368 A1 | 7/2010 | Schatz et al. |
| 2010/0171370 A1 | 7/2010 | Karalis et al. |
| 2010/0179384 A1 | 7/2010 | Hoeg et al. |

(56) References Cited

U.S. PATENT DOCUMENTS

| | | |
|---|---|---|
| 2010/0181843 A1 | 7/2010 | Schatz et al. |
| 2010/0181844 A1 | 7/2010 | Karalis et al. |
| 2010/0181845 A1 | 7/2010 | Fiorello et al. |
| 2010/0181961 A1 | 7/2010 | Novak et al. |
| 2010/0181964 A1 | 7/2010 | Huggins et al. |
| 2010/0184371 A1 | 7/2010 | Cook et al. |
| 2010/0187911 A1 | 7/2010 | Joannopoulos et al. |
| 2010/0187913 A1 | 7/2010 | Smith et al. |
| 2010/0188183 A1 | 7/2010 | Shpiro |
| 2010/0190435 A1 | 7/2010 | Cook et al. |
| 2010/0190436 A1 | 7/2010 | Cook et al. |
| 2010/0194206 A1 | 8/2010 | Burdo et al. |
| 2010/0194207 A1 | 8/2010 | Graham |
| 2010/0194334 A1 | 8/2010 | Kirby et al. |
| 2010/0194335 A1 | 8/2010 | Kirby et al. |
| 2010/0201189 A1 | 8/2010 | Kirby et al. |
| 2010/0201201 A1 | 8/2010 | Mobarhan et al. |
| 2010/0201202 A1 | 8/2010 | Kirby et al. |
| 2010/0201203 A1 | 8/2010 | Schatz et al. |
| 2010/0201204 A1 | 8/2010 | Sakoda et al. |
| 2010/0201205 A1 | 8/2010 | Karalis et al. |
| 2010/0201310 A1 | 8/2010 | Vorenkamp et al. |
| 2010/0201312 A1 | 8/2010 | Kirby et al. |
| 2010/0201313 A1 | 8/2010 | Vorenkamp et al. |
| 2010/0201316 A1 | 8/2010 | Takada et al. |
| 2010/0201513 A1 | 8/2010 | Vorenkamp et al. |
| 2010/0207458 A1 | 8/2010 | Joannopoulos et al. |
| 2010/0210233 A1 | 8/2010 | Cook et al. |
| 2010/0213770 A1 | 8/2010 | Kikuchi |
| 2010/0213895 A1 | 8/2010 | Keating et al. |
| 2010/0217553 A1 | 8/2010 | Von Novak et al. |
| 2010/0219694 A1 | 9/2010 | Kurs et al. |
| 2010/0219695 A1 | 9/2010 | Komiyama et al. |
| 2010/0219696 A1 | 9/2010 | Kojima |
| 2010/0222010 A1 | 9/2010 | Ozaki et al. |
| 2010/0225175 A1 | 9/2010 | Karalis et al. |
| 2010/0225270 A1 | 9/2010 | Jacobs et al. |
| 2010/0225271 A1 | 9/2010 | Oyobe et al. |
| 2010/0225272 A1 | 9/2010 | Kirby et al. |
| 2010/0231053 A1 | 9/2010 | Karalis et al. |
| 2010/0231163 A1 | 9/2010 | Mashinsky |
| 2010/0231340 A1 | 9/2010 | Fiorello et al. |
| 2010/0234922 A1 | 9/2010 | Forsell |
| 2010/0235006 A1 | 9/2010 | Brown |
| 2010/0237706 A1 | 9/2010 | Karalis et al. |
| 2010/0237707 A1 | 9/2010 | Karalis et al. |
| 2010/0237708 A1 | 9/2010 | Karalis et al. |
| 2010/0237709 A1 | 9/2010 | Hall et al. |
| 2010/0244576 A1 | 9/2010 | Hillan et al. |
| 2010/0244577 A1 | 9/2010 | Shimokawa |
| 2010/0244578 A1 | 9/2010 | Yoshikawa |
| 2010/0244579 A1 | 9/2010 | Sogabe et al. |
| 2010/0244580 A1 | 9/2010 | Uchida et al. |
| 2010/0244581 A1 | 9/2010 | Uchida |
| 2010/0244582 A1 | 9/2010 | Yoshikawa |
| 2010/0244583 A1 | 9/2010 | Shimokawa |
| 2010/0244767 A1 | 9/2010 | Turner et al. |
| 2010/0244839 A1 | 9/2010 | Yoshikawa |
| 2010/0248622 A1 | 9/2010 | Lyell Kirby et al. |
| 2010/0253152 A1 | 10/2010 | Karalis et al. |
| 2010/0253281 A1 | 10/2010 | Li |
| 2010/0256481 A1 | 10/2010 | Mareci et al. |
| 2010/0256831 A1 | 10/2010 | Abramo et al. |
| 2010/0259108 A1 | 10/2010 | Giler et al. |
| 2010/0259109 A1 | 10/2010 | Sato |
| 2010/0259110 A1 | 10/2010 | Kurs et al. |
| 2010/0264745 A1 | 10/2010 | Karalis et al. |
| 2010/0264746 A1 | 10/2010 | Kazama et al. |
| 2010/0264747 A1 | 10/2010 | Hall et al. |
| 2010/0276995 A1 | 11/2010 | Marzetta et al. |
| 2010/0277003 A1 | 11/2010 | Von Novak et al. |
| 2010/0277004 A1 | 11/2010 | Suzuki et al. |
| 2010/0277005 A1 | 11/2010 | Karalis et al. |
| 2010/0277120 A1 | 11/2010 | Cook et al. |
| 2010/0277121 A1 | 11/2010 | Hall et al. |
| 2010/0289341 A1 | 11/2010 | Ozaki et al. |
| 2010/0289449 A1 | 11/2010 | Elo |
| 2010/0295505 A1 | 11/2010 | Jung et al. |
| 2010/0295506 A1 | 11/2010 | Ichikawa |
| 2010/0308939 A1 | 12/2010 | Kurs |
| 2010/0314946 A1 | 12/2010 | Budde et al. |
| 2010/0327660 A1 | 12/2010 | Karalis et al. |
| 2010/0327661 A1 | 12/2010 | Karalis et al. |
| 2010/0328044 A1 | 12/2010 | Waffenschmidt et al. |
| 2011/0004269 A1 | 1/2011 | Strother et al. |
| 2011/0012431 A1 | 1/2011 | Karalis et al. |
| 2011/0018361 A1 | 1/2011 | Karalis et al. |
| 2011/0025131 A1 | 2/2011 | Karalis et al. |
| 2011/0031928 A1 | 2/2011 | Soar |
| 2011/0043046 A1 | 2/2011 | Joannopoulos et al. |
| 2011/0043047 A1 | 2/2011 | Karalis et al. |
| 2011/0043048 A1 | 2/2011 | Karalis et al. |
| 2011/0043049 A1 | 2/2011 | Karalis et al. |
| 2011/0049995 A1 | 3/2011 | Hashiguchi |
| 2011/0049996 A1 | 3/2011 | Karalis et al. |
| 2011/0049998 A1 | 3/2011 | Karalis et al. |
| 2011/0074218 A1 | 3/2011 | Karalis et al. |
| 2011/0074346 A1 | 3/2011 | Hall et al. |
| 2011/0074347 A1 | 3/2011 | Karalis et al. |
| 2011/0089895 A1 | 4/2011 | Karalis et al. |
| 2011/0095618 A1 | 4/2011 | Schatz et al. |
| 2011/0115303 A1 | 5/2011 | Baarman et al. |
| 2011/0115431 A1 | 5/2011 | Dunworth et al. |
| 2011/0121920 A1 | 5/2011 | Kurs et al. |
| 2011/0128015 A1 | 6/2011 | Dorairaj et al. |
| 2011/0140544 A1 | 6/2011 | Karalis et al. |
| 2011/0148219 A1 | 6/2011 | Karalis et al. |
| 2011/0162895 A1 | 7/2011 | Karalis et al. |
| 2011/0169339 A1 | 7/2011 | Karalis et al. |
| 2011/0181122 A1 | 7/2011 | Karalis et al. |
| 2011/0193416 A1 | 8/2011 | Campanella et al. |
| 2011/0193419 A1 | 8/2011 | Karalis et al. |
| 2011/0198939 A1 | 8/2011 | Karalis et al. |
| 2011/0215086 A1 | 9/2011 | Yeh |
| 2011/0221278 A1 | 9/2011 | Karalis et al. |
| 2011/0227528 A1 | 9/2011 | Karalis et al. |
| 2011/0227530 A1 | 9/2011 | Karalis et al. |
| 2011/0241618 A1 | 10/2011 | Karalis et al. |
| 2011/0248573 A1 | 10/2011 | Kanno et al. |
| 2011/0254377 A1 | 10/2011 | Wildmer et al. |
| 2011/0254503 A1 | 10/2011 | Widmer et al. |
| 2011/0266878 A9 | 11/2011 | Cook et al. |
| 2011/0278943 A1 | 11/2011 | Eckhoff et al. |
| 2011/0282415 A1 | 11/2011 | Eckhoff et al. |
| 2012/0001492 A9 | 1/2012 | Cook et al. |
| 2012/0001593 A1 | 1/2012 | DiGuardo |
| 2012/0007435 A1 | 1/2012 | Sada et al. |
| 2012/0007441 A1 | 1/2012 | John et al. |
| 2012/0025602 A1 | 2/2012 | Boys et al. |
| 2012/0032522 A1 | 2/2012 | Schatz et al. |
| 2012/0038525 A1 | 2/2012 | Monsalve Carcelen et al. |
| 2012/0062345 A1 | 3/2012 | Kurs et al. |
| 2012/0068549 A1 | 3/2012 | Karalis et al. |
| 2012/0086284 A1 | 4/2012 | Capanella et al. |
| 2012/0086867 A1 | 4/2012 | Kesler et al. |
| 2012/0091794 A1 | 4/2012 | Campanella et al. |
| 2012/0091795 A1 | 4/2012 | Fiorello et al. |
| 2012/0091796 A1 | 4/2012 | Kesler et al. |
| 2012/0091797 A1 | 4/2012 | Kesler et al. |
| 2012/0091819 A1 | 4/2012 | Kulikowski et al. |
| 2012/0091820 A1 | 4/2012 | Campanella et al. |
| 2012/0091949 A1 | 4/2012 | Campanella et al. |
| 2012/0091950 A1 | 4/2012 | Campanella et al. |
| 2012/0098350 A1 | 4/2012 | Campanella et al. |
| 2012/0112531 A1 | 5/2012 | Kesler et al. |
| 2012/0112532 A1 | 5/2012 | Kesler et al. |
| 2012/0112534 A1 | 5/2012 | Kesler et al. |
| 2012/0112535 A1 | 5/2012 | Karalis et al. |
| 2012/0112536 A1 | 5/2012 | Karalis et al. |
| 2012/0112538 A1 | 5/2012 | Kesler et al. |
| 2012/0112691 A1 | 5/2012 | Kurs et al. |
| 2012/0119569 A1 | 5/2012 | Karalis et al. |
| 2012/0119575 A1 | 5/2012 | Kurs et al. |
| 2012/0119576 A1 | 5/2012 | Kesler et al. |

(56) References Cited

U.S. PATENT DOCUMENTS

| | | |
|---|---|---|
| 2012/0119698 A1 | 5/2012 | Karalis et al. |
| 2012/0139355 A1 | 6/2012 | Ganem et al. |
| 2012/0146575 A1 | 6/2012 | Armstrong et al. |
| 2012/0153732 A1* | 6/2012 | Kurs et al. ............... 307/104 |
| 2012/0153733 A1 | 6/2012 | Schatz et al. |
| 2012/0153734 A1 | 6/2012 | Kurs et al. |
| 2012/0153735 A1 | 6/2012 | Karalis et al. |
| 2012/0153736 A1 | 6/2012 | Karalis et al. |
| 2012/0153737 A1 | 6/2012 | Karalis et al. |
| 2012/0153738 A1 | 6/2012 | Karalis et al. |
| 2012/0153893 A1 | 6/2012 | Schatz et al. |
| 2012/0184338 A1 | 7/2012 | Kesler et al. |
| 2012/0206096 A1 | 8/2012 | John |
| 2012/0223573 A1 | 9/2012 | Schatz et al. |
| 2012/0228952 A1 | 9/2012 | Hall et al. |
| 2012/0228953 A1 | 9/2012 | Kesler et al. |
| 2012/0228954 A1 | 9/2012 | Kesler et al. |
| 2012/0235500 A1 | 9/2012 | Ganem et al. |
| 2012/0235501 A1 | 9/2012 | Kesler et al. |
| 2012/0235502 A1 | 9/2012 | Kesler et al. |
| 2012/0235503 A1 | 9/2012 | Kesler et al. |
| 2012/0235504 A1 | 9/2012 | Kesler et al. |
| 2012/0235505 A1 | 9/2012 | Schatz et al. |
| 2012/0235566 A1 | 9/2012 | Karalis et al. |
| 2012/0235567 A1 | 9/2012 | Karalis et al. |
| 2012/0235633 A1 | 9/2012 | Kesler et al. |
| 2012/0235634 A1 | 9/2012 | Hall et al. |
| 2012/0239117 A1 | 9/2012 | Kesler et al. |
| 2012/0242159 A1 | 9/2012 | Lou et al. |
| 2012/0242225 A1 | 9/2012 | Karalis et al. |
| 2012/0248884 A1 | 10/2012 | Karalis et al. |
| 2012/0248886 A1 | 10/2012 | Kesler et al. |
| 2012/0248887 A1 | 10/2012 | Kesler et al. |
| 2012/0248888 A1 | 10/2012 | Kesler et al. |
| 2012/0248981 A1 | 10/2012 | Karalis et al. |
| 2012/0256494 A1 | 10/2012 | Kesler et al. |
| 2012/0267960 A1 | 10/2012 | Low et al. |
| 2012/0280765 A1 | 11/2012 | Kurs et al. |
| 2012/0313449 A1 | 12/2012 | Kurs et al. |
| 2012/0313742 A1 | 12/2012 | Kurs et al. |
| 2013/0007949 A1 | 1/2013 | Kurs et al. |
| 2013/0020878 A1 | 1/2013 | Karalis et al. |
| 2013/0033118 A1 | 2/2013 | Karalis et al. |
| 2013/0038402 A1 | 2/2013 | Karalis et al. |
| 2013/0057364 A1 | 3/2013 | Kesler et al. |
| 2013/0062966 A1 | 3/2013 | Verghese et al. |
| 2013/0069441 A1 | 3/2013 | Verghese et al. |
| 2013/0069753 A1 | 3/2013 | Kurs et al. |
| 2013/0099587 A1 | 4/2013 | Lou |
| 2013/0154383 A1 | 6/2013 | Kasturi et al. |
| 2013/0154389 A1 | 6/2013 | Kurs et al. |
| 2013/0159956 A1 | 6/2013 | Verghese et al. |
| 2013/0175874 A1 | 7/2013 | Lou et al. |
| 2013/0175875 A1 | 7/2013 | Kurs et al. |
| 2013/0200716 A1 | 8/2013 | Kesler et al. |
| 2013/0200721 A1 | 8/2013 | Kurs et al. |
| 2013/0221744 A1 | 8/2013 | Hall et al. |
| 2013/0278073 A1 | 10/2013 | Kurs et al. |
| 2013/0278074 A1 | 10/2013 | Kurs et al. |
| 2013/0278075 A1 | 10/2013 | Kurs et al. |
| 2013/0300353 A1 | 11/2013 | Kurs et al. |
| 2013/0307349 A1 | 11/2013 | Hall et al. |
| 2013/0320773 A1 | 12/2013 | Schatz et al. |
| 2013/0334892 A1 | 12/2013 | Hall et al. |
| 2014/0002012 A1 | 1/2014 | McCauley et al. |
| 2014/0021798 A1 | 1/2014 | Kesler et al. |
| 2014/0035378 A1 | 2/2014 | Kesler et al. |
| 2014/0044281 A1 | 2/2014 | Ganem et al. |
| 2014/0044293 A1 | 2/2014 | Ganem et al. |
| 2014/0070764 A1 | 3/2014 | Keeling |

FOREIGN PATENT DOCUMENTS

| | | | |
|---|---|---|---|
| CN | 102439669 | 5/2012 | |
| CN | 103329397 | 9/2013 | |
| DE | 3824972 A1 | 1/1989 | |
| DE | 10029147 A1 | 12/2001 | |
| DE | 20016655 U1 | 2/2002 | |
| DE | 10221484 A1 | 11/2003 | |
| DE | 10304584 A1 | 8/2004 | |
| DE | 102005036290 A1 | 2/2007 | |
| DE | 102006044057 A1 | 4/2008 | |
| EP | 1335477 A2 | 8/2003 | |
| EP | 1 521 206 | 4/2005 | |
| EP | 1 524 010 | 4/2005 | |
| EP | 2357716 A2 | 8/2011 | |
| JP | 02097005 A | 4/1990 | |
| JP | 04265875 A | 9/1992 | |
| JP | 6-341410 | 12/1994 | |
| JP | 09182323 A | 7/1997 | |
| JP | 09298847 A | 11/1997 | |
| JP | 10164837 A | 6/1998 | |
| JP | 11075329 A | 3/1999 | |
| JP | 11188113 A | 7/1999 | |
| JP | 2001309580 A | 11/2001 | |
| JP | 2002010535 A | 1/2002 | |
| JP | 2003179526 A | 6/2003 | |
| JP | 2004166459 A | 6/2004 | |
| JP | 2004201458 A | 7/2004 | |
| JP | 2004-229144 | 8/2004 | |
| JP | 2005057444 A | 3/2005 | |
| JP | 2005149238 A | 6/2005 | |
| JP | 2006-074848 | 3/2006 | |
| JP | 2007505480 A | 3/2007 | |
| JP | 2007-266892 | 10/2007 | |
| JP | 2007537637 A | 12/2007 | |
| JP | 2008508842 A | 3/2008 | |
| JP | 2008-206231 | 9/2008 | |
| JP | 2008206231 A | 9/2008 | |
| JP | 2008206327 A | 9/2008 | |
| JP | 2011072074 A | 4/2011 | |
| JP | 2012-504387 | 2/2012 | |
| JP | 2013-543718 | 12/2013 | |
| KR | 10-2007-0017804 | 2/2007 | |
| KR | 1020080007635 A | 1/2008 | |
| KR | 1020090122072 A | 11/2009 | |
| SG | 112842 | 7/2005 | |
| WO | 9217929 A1 | 10/1992 | |
| WO | 9323908 A1 | 11/1993 | |
| WO | 9428560 A1 | 12/1994 | |
| WO | WO 95/11545 | 4/1995 | |
| WO | 9602970 A1 | 2/1996 | |
| WO | 9850993 A1 | 11/1998 | |
| WO | 0077910 A1 | 12/2000 | |
| WO | WO 03/058749 | * 7/2003 | ............. H01P 1/203 |
| WO | 03092329 A1 | 11/2003 | |
| WO | 03096361 A1 | 11/2003 | |
| WO | 03096512 A2 | 11/2003 | |
| WO | WO 2004/015885 | 2/2004 | |
| WO | 2004038888 A2 | 5/2004 | |
| WO | 2004055654 A2 | 7/2004 | |
| WO | 2004073150 A1 | 8/2004 | |
| WO | 2004073166 A2 | 8/2004 | |
| WO | 2004073176 A2 | 8/2004 | |
| WO | 2004073177 A2 | 8/2004 | |
| WO | 2004112216 A1 | 12/2004 | |
| WO | 2005024865 A2 | 3/2005 | |
| WO | 2005060068 A1 | 6/2005 | |
| WO | 2005109597 A1 | 11/2005 | |
| WO | 2005109598 A1 | 11/2005 | |
| WO | 2006011769 A1 | 2/2006 | |
| WO | 2007008646 A2 | 1/2007 | |
| WO | 2007020583 A2 | 2/2007 | |
| WO | 2007042952 A1 | 4/2007 | |
| WO | 2007084716 A2 | 7/2007 | |
| WO | 2007084717 A2 | 7/2007 | |
| WO | 2008109489 A2 | 9/2008 | |
| WO | 2008118178 A1 | 10/2008 | |
| WO | 2009009559 A1 | 1/2009 | |
| WO | 2009018568 A2 | 2/2009 | |

(56) References Cited

FOREIGN PATENT DOCUMENTS

| | | | |
|---|---|---|---|
| WO | 2009023155 A2 | 2/2009 |
| WO | 2009023646 A2 | 2/2009 |
| WO | 2009033043 A2 | 3/2009 |
| WO | 2009062438 A1 | 5/2009 |
| WO | 2009070730 A2 | 6/2009 |
| WO | 2009126963 A2 | 10/2009 |
| WO | 2009140506 A1 | 11/2009 |
| WO | 2009149464 A2 | 12/2009 |
| WO | 2009155000 A2 | 12/2009 |
| WO | 2010030977 A2 | 3/2010 |
| WO | 2010036980 A1 | 4/2010 |
| WO | 2010039967 A1 | 4/2010 |
| WO | 2010090538 A1 | 8/2010 |
| WO | 2010090539 A1 | 8/2010 |
| WO | 2010093997 A1 | 8/2010 |
| WO | 2010104569 A1 | 9/2010 |
| WO | 2011061388 A1 | 5/2011 |
| WO | 2011061821 A1 | 5/2011 |
| WO | 2011062827 A2 | 5/2011 |
| WO | 20110618210 A | 5/2011 |
| WO | 2011112795 A1 | 9/2011 |
| WO | 2012037279 A1 | 3/2012 |
| WO | 2012170278 A2 | 12/2012 |
| WO | 2012170278 A3 | 1/2013 |
| WO | 2013013235 A2 | 1/2013 |
| WO | 2013020138 A2 | 2/2013 |
| WO | 2013036947 A2 | 3/2013 |
| WO | 2013020138 A3 | 4/2013 |
| WO | 2013059441 A1 | 4/2013 |
| WO | 2013013235 A3 | 5/2013 |
| WO | 2013036947 A3 | 5/2013 |
| WO | 2013067484 A1 | 5/2013 |
| WO | 2013/113017 A1 | 8/2013 |
| WO | 2013/142840 A1 | 9/2013 |
| WO | 2014/004843 A1 | 1/2014 |

OTHER PUBLICATIONS

International Application Serial No. PCT/US2011/051634, International Preliminary Report on Patentability mailed Mar. 28, 2013, 8 pages.
International Application Serial No. PCT/US2012/047844, International Search Report and Written Opinion mailed Mar. 25, 2013, 9 pages.
International Application Serial No. PCT/US2012/049777, International Search Report and Written Opinion mailed Jan. 23, 2013, 10 pages.
International Application Serial No. PCT/US2012/054490, International Search Report and Written Opinion mailed Feb. 28, 2013, 8 pages.
International Application Serial No. PCT/US2012/060793, International Search Report and Written Opinion, mailed Mar. 8, 2013, 13 pages.
International Application Serial No. PCT/US2012/063530, International Search Report and Written Opinion mailed Mar. 13, 2013, 16 pages.
International Application Serial No. PCT/US2013/023478, International Search Report and Written Opinion mailed Jun. 25, 2013, 15 pages.
"In pictures: A year in technology", BBC News, http://news.bbc.co.uk/2/hi/in_pictures/7129507.stm, Dec. 28, 2007, 2 pages.
"European Application No. 06786588, 1-1242, Examination Report mailed Jan. 15, 2009", 5 pages.
"U.S. Appl. No. 12/613,686, Notice of Allowance mailed Jan. 6, 2011", 10 pages.
"U.S. Appl. No. 12/613,686, Notice of Allowance mailed Mar. 7, 2011", 8 Pages.
"Australian Application Serial No. 200626937 4, Examination Report mailed Sep. 18, 2008", 3 pages.
"U.S. Appl. No. 60/698,442, "Wireless Non-Radiative Energy Transfer", filed on Jul. 12, 2005", 14 pages.
"U.S. Appl. No. 60/908,383, "Wireless Energy Transfer", filed Mar. 27, 2007", 80 pages.
"U.S. Appl. No. 60/908,666, "Wireless Energy Transfer", filed Mar. 28, 2007", 108 pages.
Abe, et al., "A Noncontact Charger Using a Resonant Converter with Parallel Capacitor of the Secondary Coil", vol. 36, No. 2, Mar./Apr. 2000, pp. 444-51.
Altchev, et al., "Efficient Resonant Inductive Coupling Energy Transfer Using New Magnetic and Design Criteria", IEEE, Jun. 16, 2005, pp. 1293-1298.
Aoki, et al., "Observation of strong coupling between one atom and a monolithic microresonator", Nature, vol. 443, Oct. 12, 2006, pp. 671-674.
Apneseth, et al., "Introducing wireless proximity switches", ABB Review, Apr. 2002, pp. 42-49.
Baker, et al., "Feedback Analysis and Design of RF Power Links for Low-Power Bionic Systems", IEEE Transactions on Biomedical Circuits and Systems, vol. 1, No. 1, Mar. 2007, pp. 28-38.
Balanis, Constantine A., "Antenna Theory: Analysis and Design", 3rd Edition Sections 4.2 4.3 5.2 5.3 (John Wiley & Sons Inc.), 2005, 39 pages.
Berardelli, Phil, "Outlets Are Out", ScienceNOW Daily News, Science Now, http://sciencenow.sciencemag.org/ cgi/content/full/2006/1114/2, Nov. 14, 2006, 2 pages.
Biever, Celeste, "'Evanescent coupling' could power gadgets wirelessly", NewScientistsTech.com, http://www.newscientisttech.com/article.ns?id=dn10575&print=true, Nov. 15, 2006, 2 pages.
Borenstein, Seth, "Man tries wirelessly boosting batteries", (The Associated Press), USA Today, Nov. 16, 2006, 1 page.
Boyle, Alan, "Electro-nirvana? Not so fast", MSNBC, http:/lcosmiclog.msnbc.msn.com/_news/2007/06/08/4350760-electro-nirvana-not-so-fast, Jun. 8, 2007, 3 pages.
Bulkeley, William M., "MIT Scientists Pave the Way for Wireless Battery Charging", The Wall Street Journal (See http://online.wsj.com/article/SB118123955549228045.html?mod=googlenews_wsj), Jun. 8, 2007, 3 pages.
Burri, et al., "Invention Description", Feb. 5, 2008, 16 pages.
Cass, Stephen, "Air Power—Wireless data connections are common—now scientists are working on wireless power", Sponsored by IEEE Spectrum, http://spectrum.ieee.org/computing/hardware/air-power, Nov. 2006, 2 pages.
Castelvecchi, Davide, "The Power of Induction—Cutting the last cord could resonate with our increasingly gadget dependent lives", Science News Online, vol. 172, No. 3, Jul. 21, 2007, 6 pages.
Chang, Angela, "Recharging the Wireless Way—Even physicists forget to recharge their cell phones sometimes.", PC Magazine, ABC News Internet Ventures, Dec. 12, 2006, 1 page.
Chinaview, "Scientists light bulb with 'wireless electricity'", www.Chinaview.cn, http://news.xinhuanet.com/english/2007-06/08/content_6215681.htm, Jun. 2007, 1 page.
Cooks, Gareth, "The vision of an MIT physicist: Getting rid of pesky rechargers", Boston.com, Dec. 11, 2006, 1 page.
Derbyshire, David, "The end of the plug? Scientists invent wireless device that beams electricity through your home", Daily Mail, http://www.dailymail.co.uk/pages/live/articles/technology/technology.html?in_article_id=4. . . ), Jun. 7, 2007, 3 pages.
Esser, et al., "A New Approach to Power Supplies for Robots.", IEEE, vol. 27, No. 5, Sep./Oct. 1991, pp. 872-875.
Fenske, et al., "Dielectric Materials at Microwave Frequencies", Applied Microwave & Wireless, 2000, pp. 92-100.
Fernandez, C. et al., "A simple dc-dc converter for the power supply of a cochlear implant", Power Electronics Specialist Conference, IEEE 34th Annual, Jun. 2003, pp. 1965-1970.
Fildes, Jonathan, "Physics Promises Wireless Power", (Science and Technology Reporter), BBC News, Nov. 15, 2006, 3 pages.
Fildes, Jonathan, "The technology with impact 2007", BBC News, Dec. 27, 2007, 3 pages.
Fildes, Jonathan, "Wireless energy promise powers up", BBC News, http://news.bbc.co.uk/2/hi/technology/6725955.stm, Jun. 7, 2007, 3 pages.
Freedman, David H., "Power on a Chip", MIT Technology Review, Nov. 2004, 3 pages.

(56) References Cited

OTHER PUBLICATIONS

Hadley, Franklin, "Goodbye Wires—MIT Team Experimentally Demonstrates Wireless Power Transfer, Potentially 32 Useful for Power Laptops, Cell-Phones Without Cords", Massachusetts Institute of Technology, Institute for Soldier D Nanotechnologies, http://web.mit.edu/newsoffice/2007/wireless-0607.html, Jun. 7, 2007, 3 pages.
Haus, H A., "Waves and Fields in Optoelectronics", Chapter 7 Coupling of Modes—Resonators and Couplers, 1984, pp. 197-234.
Heikkinen, et al., "Performance and Efficiency of Planar Rectennas for Short-Range Wireless Power Transfer at 2.45 GHz", Microwave and Optical Technology Letters, vol. 31, No. 2, Oct. 20, 2001, pp. 86-91.
Highfield, Roger, "Wireless revolution could spell end of plugs", (Science Editor), Telegraph.co.uk, http://www.telegraph.co.uk/news/main.jhtml?xml=/news/2007/06/07/nwireless107.xml, Jun. 7, 2007, 3 pages.
Hirai, et al., "Integral Motor with Driver and Wireless Transmission of Power and Information for Autonomous Subspindle Drive", IEEE, vol. 15, No. 1, Jan. 2000, pp. 13-20.
Hirai, et al., "Practical Study on Wireless Transmission of Power and Information for Autonomous Decentralized Manufacturing System", IEEE, vol. 46, No. 2, Apr. 1999, pp. 349-359.
Hirai, et al., "Study on Intelligent Battery Charging Using Inductive Transmission of Power and Information", IEEE, vol. 15, No. 2, Mar. 2000, pp. 335-345.
Hirai, et al., "Wireless Transmission of Power and Information and Information for Cableless Linear Motor Drive", IEEE, vol. 15, No. 1, Jan. 2000, pp. 21-27.
Hirayama, Makoto, "Splashpower—World Leaders in Wireless Power", PowerPoint presentation, Splashpower Japan, Sep. 3, 2007, 30 pages.
InfoTech Online, "Recharging gadgets without cables", infotech.indiatimes.com, Nov. 17, 2006, 1 page.
Texas Instruments, "HF Antenna Design Notes", Technical Application Report, Literature No. 11-08-26-003, Sep. 2003, 47 pages.
Intel News Release, "Intel CTO Says Gap between Humans, Machines Will Close by 2050", (intel.com/.../20080821comp.htm?iid=S . . . ), Printed Nov. 6, 2009, 2 pages.
Jackson, J D., "Classical Electrodynamics", 3rd Edition, 1999, pp. 201-203.
Jacob, M. V. et al., "Lithium Tantalate—A High Permittivity Dielectric Material for Microwave Communication Systems", Proceedings of IEEE TENCON—Poster Papers, 2003, pp. 1362-1366.
Karalis, Aristeidis et al., "Efficient Wireless non-radiative mid-range energy transfer", Annals of Physics, vol. 323, 2008, pp. 34-48.
Karalls, Aristeidis, "Electricity Unplugged", Feature: Wireless Energy Physics World, physicsworld.com, Feb. 2009, pp. 23-25.
Kawamura, et al., "Wireless Transmission of Power and Information Through One High-Frequency Resonant AC Link Inverter for Robot Manipulator Applications", IEEE, vol. 32, No. 3, May/Jun. 1996, pp. 503-508.
Konishi, Yoshihiro, "Microwave Electronic Circuit Technology", (Marcel Dekker Inc. New York NY 1998), Chapter 4, 1998, pp. 145-197.
Kurs, A et al., "Optimized design of a low-resistance electrical conductor for the multimegahertz range", Applied Physics Letters, vol. 98, Apr. 2011, pp. 172504-172504-3.
Kurs, Andre et al., "Simultaneous mid-range power transfer to multiple devices", Applied Physics Letters, vol. 96, Jan. 26, 2010, pp. 044102-044102-3.
Kurs, Andre et al., "Wireless Power Transfer via Strongly Coupled Magnetic Resonances", Science vol. 317, No. 5834, Jul. 6, 2007, pp. 83-86.
Lamb, Gregory M., "Look Ma—no wires!—Electricity broadcast through the air may someday run your home", The Christian Science Monitor, http://www.csmonitor.com/2006/1116/p14s01-stct.html, Nov. 15, 2006, 4 pages.
Lee, "Antenna Circuit Design for RFID Applications", Microchip Technology Inc., AN710, Jan. 21, 2003, 50 pages.
Lee, "RFID Coil Design", Microchip Technology Inc., AN678, 1998, 21 pages.
Liang, et al., "Silicon waveguide two-photon absorption detector at 1.5 µm wavelength for autocorrelation measurements", Applied Physics Letters, vol. 81, No. 7, Aug. 12, 2002, pp. 1323-1325.
Markoff, John, "Intel Moves to Free Gadgets of Their Recharging Cords", The New York Times—nytimes.com, Aug. 21, 2008, 2 pages.
Mediano, A. et al., "Design of class E amplifier with nonlinear and linear shunt capacitances for any duty cycle", IEEE Trans. Microwave Theor. Tech., vol. 55, No. 3, Mar. 2007, pp. 484-492.
Microchip Technology Inc., "MCRF355/360 Reader Reference Design", microID 13.56 MHz Design Guide, 2001, 24 pages.
Minkel, J R., "Wireless Energy Lights Bulb from Seven Feet Away—Physicists vow to cut the cord between your laptop battery and the wall socket—with just a simple loop of wire", Scientific American, http://www.scientificamerican.com/article.cfm?id=wireless-energy-lights-bulb-from-seven-feet-away, Jun. 7, 2007, 1 page.
Minkel, J R., "Wireless Energy Transfer May Power Devices at a Distance", Scientific American, Nov. 14, 2006, 1 page.
Morgan, James, "Lab report: Pull the plug for a positive charge", The Herald, Web Issue 2680, Nov. 16, 2006, 3 pages.
O'Brien, et al., "Analysis of Wireless Power Supplies for Industrial Automation Systems", IEEE, Nov. 2-6, 2003, pp. 367-372.
O'Brien, et al., "Design of Large Air-Gap Transformers for Wireless Power Supplies", IEEE, Jun. 15-19, 2003, pp. 1557-1562.
"International Application Serial No. PCT/US2006/026480, International Preliminary Report on Patentability issued Jan. 29, 2008", 8 pages.
"International Application Serial No. PCT/US2006/026480, International Search Report and Written Opinion mailed Dec. 21, 2007", 13 pages.
"International Application Serial No. PCT/US2007/070892, International Preliminary Report on Patentability mailed Sep. 29, 2009", 14 pages.
"International Application Serial No. PCT/US2007/070892, International Search Report and Written Opinion mailed Mar. 3, 2008", 21 pages.
"International Application Serial No. PCT/US2009/043970, International Search Report and Written Opinion mailed Jul. 14, 2009", 9 pages.
"International Application Serial No. PCT/US2009/058499, International Preliminary Report on Patentability mailed Mar. 29, 2011", 5 pages.
"International Application Serial No. PCT/US2009/058499, International Search Report and Written Opinion mailed Dec. 10, 2009", 6 pages.
"International Application Serial No. PCT/US2009/059244, International Search Report mailed Dec. 7, 2009", 12 pages.
"International Application Serial No. PCT/US2010/024199, International Preliminary Report on Patentability mailed Aug. 25, 2011", 8 pages.
"International Application Serial No. PCT/US2010/024199, Search Report and Written Opinion mailed May 14, 2010", 12 pages.
"International Application Serial No. PCT/US2011/027868, International Preliminary Report on Patentability mailed Sep. 20, 2012", 8 pages.
"International Application Serial No. PCT/US2011/027868, International Search Report and Written mailed Jul. 5, 2011", 9 pages.
"International Application Serial No. PCT/US2011/051634 , International Search Report and Written Opinion mailed Jan. 6, 2012", 11 pages.
"International Application No. PCT/US2011/054544, International Search Report and Written Opinion mailed Jan. 30, 2012", 17 pages.
"International Application Serial No. PCT/US2012/040184, International Search Report and Written Opinion mailed Nov. 28, 2012", Witricity Corporation et al., 8 pages.
Pendry, J B., "A Chiral Route to Negative Refraction", Science, vol. 306, Nov. 19, 2004, pp. 1353-1355.
Peterson, Gary, "MIT WiTricity Not So Original After All", Feed Line No. 9:, http://www.tfcbooks.com/articles/ witricity.htm, accessed on Nov. 12, 2009, pp. 1-3.

(56) References Cited

OTHER PUBLICATIONS

Physics Today, "Unwired Energy", section in Physics Update, www.physicstoday.org, http://arxiv.org/abs/physics/0611063, Jan. 2007, p. 26.
Physics Today, "Unwired energy questions asked answered", Sep. 2007, pp. 16-17.
Powercast LLC, "White Paper", Powercast simply wire free, 2003, 2 pages.
PR News Wire, "The Big Story for CES 2007: The public debut of eCoupled Intelligent Wireless Power", Press Release, Fulton Innovation LLC, Las Vegas, NV, Dec. 27, 2006, 3 pages.
Press Release, "The world's first sheet-type wireless power transmission system: Will a socket be replaced by e-wall?", Public Relations Office, School of Engineering, University of Tokyo, Japan, Dec. 12, 2006, 4 pages.
PressTV, "Wireless power transfer possible", http://edition.presstv.ir/detail/12754.html, Jun. 11, 2007, 1 page.
Reidy, Chris (Globe Staff), "MIT discovery could unplug your iPod forever", Boston.com, http://www.boston.com/business/ticker/2007/06/mit_discovery_c.html, Jun. 7, 2007, 3 pages.
Risen, Clay, "Wireless Energy", The New York Times, Dec. 9, 2007, 1 page.
Sakamoto, et al., "A Novel Circuit for Non-Contact Charging Through Electro-Magnetic Coupling", IEEE, Jun. 29-Jul. 3, 1992, pp. 3228-3230.
Scheible, G et al., "Novel Wireless Power Supply System for Wireless Communication Devices in Industrial Automation Systems", IEEE, Nov. 5-8, 2002, pp. 1358-1363.
Schneider, David, "Electrons Unplugged. Wireless power at a distance is still far away", IEEE Spectrum, May 2010, pp. 35-39.
Schuder, J. C. et al., "Energy Transport Into the Closed Chest From a Set of Very-Large Mutually Orthogonal Coils", Communication Electronics, vol. 64, Jan. 1963, pp. 527-534.
Schuder, John C. et al., "An Inductively Coupled RF System for the Transmission of 1 kW of Power Through the Skin", IEEE Transactions on Bio-Medical Engineering, vol. BME-18, No. 4, Jul. 1971, pp. 265-273.
Schuder, John C., "Powering an Artificial Heart: Birth of the Inductively Coupled-Radio Frequency System in 1960", Artificial Organs, vol. 26, No. 11, Nov. 2002, pp. 909-915.
Schutz, J. et al., "Load Adaptive Medium Frequency Resonant Power Supply", IEEE, Nov. 2002, pp. 282-287.
Sekitani, et al., "A large-area flexible wireless power transmission sheet using printed plastic MEMS switches and organic field-effect transistors", IEDM '06. International Electron Devices Meeting, 2006, Dec. 11-13, 2006, 4 pages.
Sekitani, et al., "A large-area wireless power-transmission sheet using printed organic transistors and plastic MEMS switches", Nature Materials 6: 413-417 (Jun. 1, 2007) Published online Apr. 29, 2007, 5 pages.
Sekiya, H. et al., "FM/PWM control scheme in class DE inverter", IEEE Trans. Circuits Syst. I, vol. 51, No. 7, Jul. 2004, pp. 1250-1260.
Senge, Miebi, "MIT's wireless electricity for mobile phones", Vanguard, http://www.vanguardngr.com/articles/2002/features/gsm/gsm211062007.htm, Jun. 11, 2007, 1 page.
Sensiper, S., "Electromagnetic wave propagation on helical conductors", Technical Report No. 194 (based on PhD Thesis), Massachusetts Institute of Technology, May 16, 1951, 125 pages.
Soljacic, "Wireless Non-Radiative Energy Transfer", PowerPoint presentation, Massachusetts Institute of Technology, Oct. 6, 2005, 14 pages.
Soljacic, Marin et al., "Photonic-crystal slow-light enhancement of nonlinear phase sensitivity", J. Opt. Soc. Am B, vol. 19, No. 9, Sep. 2002, pp. 2052-2059.
Soljacic, Marin et al., "Wireless Energy Transfer Can Potentially Recharge Laptops Cell Phones Without Cords", Nov. 14, 2006, 3 pages.
Soljacic, Marin, "Wireless nonradiative energy transfer", Visions of Discovery New Light on Physics, Cosmology and Consciousness, Cambridge University Press, New York, 2011, pp. 530-542.
Someya, Takao, "The world's first sheet-type wireless power transmission system", Press Interview Handout, University of Tokyo, Dec. 12, 2006, 18 pages.
Staelin, David H. et al., "Electromagnetic Waves", (Prentice Hall Upper Saddle River, New Jersey, 1998), Chapters 2, 3, 4, and 8, 1998, pp. 46-176 and 336-405.
Stark III, Joseph C., "Wireless Power Transmission Utilizing a Phased Array of Tesla Coils", Master Thesis, Massachusetts Institute of Technology, 2004, 247 pages.
Tesla, Nikola, "High Frequency Oscillators for Electro-Therapeutic and Other Purposes", The Electrical Engineer, vol. XXVI, No. 550, Nov. 17, 1898, 5 pages.
Tesla, Nikola, "High Frequency Oscillators for Electro-Therapeutic and Other Purposes", Proceedings of the IEEE, vol. 87, No. 7, Jul. 1999, pp. 1282-1292.
Thomsen, et al., "Ultrahigh speed all-optical demultiplexing based on two-photon absorption in a laser diode", Electronics Letters, vol. 34, No. 19, Sep. 17, 1998, pp. 1871-1872.
UPM RAFSEC, "Tutorial overview of inductively coupled RFID Systems", http://www.rafsec.com/rfidsystems.pdf, May 2003, 7 pages.
Vandevoorde, et al., "Wireless energy transfer for stand-alone systems: a comparison between low and high power applicability", Sensors and Actuators A 92, Jul. 17, 2001, pp. 305-311.
Vilkomerson, David et al., "Implantable Doppler System for Self-Monitoring Vascular Grafts", IEEE Ultrasonics Symposium, Aug. 23-27, 2004, pp. 461-465.
Wen, Geyi, "A Method for the Evaluation of Small Antenna Q.", IEEE Transactions on Antennas and Propagation, vol. 51, No. 8, Aug. 2003, pp. 2124-2129.
Yariv, Amnon et al., "Coupled-resonator optical waveguide: a proposal and analysis", Optics Letters, vol. 24, No. 11, Jun. 1, 1999, pp. 711-713.
Zierhofer, Clemens M. et al., "High-Efficiency Coupling-Insensitive Transcutaneous Power and Data Transmission Via an Inductive Link", IEEE Transactions on Biomedical Engineering, vol. 37 No. 7, Jul. 1990, pp. 716-722.
Jackson, J. D., "Classical Electrodynamics", 3rd Edition, Wiley, New York, Sections 1.11, 5.5, 5.17, 6.9, 8.1, 8.8, 9.2, and 9.3, 1999, pp. 40-43, 181-184, 215-218, 264-267, 352-356, 371-374, 410-416.
Machine Translation for Japanese Patent Application No. JPH09182323 which published on Jul. 11, 1997, 8 pages.
Budhia, Mickel et al., "A New IPT Magnetic Coupler for Electric Vehicle Charging Systems", IECON 2010—36th Annual Conference on IEEE Industrial Electronics Society, Glendale, AZ, Nov. 7-10, 2010, pp. 2487-2492.
Budhia, Mickel et al., "Development and Evaluation of Single Sided Flux Couplers for Contactless Electric Vehicle Charging", IEEE Energy Conversion Congress and Exposition (ECCE), Phoenix, AZ, Sep. 17-22, 2011, pp. 614-621.
Budhia, Mickel et al., "Development of a Single-Sided Flux Magnetic Coupler for Electric Vehicle IPT Charging Systems", IEEE Transactions on Industrial Electronics, vol. 60, No. 1, Jan. 2013, pp. 318-328.
International Application Serial No. PCT/US2012/040184, International Preliminary Report on Patentability and Written Opinion mailed Dec. 27, 2013, Witricity Corporation, 7 pages.
International Application Serial No. PCT/US2012/047844, International Preliminary Report on Patentability and Written Opinion mailed on Jan. 30, 2014, Witricity Corporation et al, 6 pages.
International Application Serial No. PCT/US2013/033599, International Search Report and Written Opinion mailed Jul. 25, 2013, Witricity Corporation, 13 pages.
International Application Serial No. PCT/US2013/048210, International Search Report mailed on Oct. 15, 2013, Witricity Corporation, 12 pages.
Tang, S.C et al., "Evaluation of the Shielding Effects on Printed-Circuit-Board Transformers Using Ferrite Plates and Copper Sheets", IEEE Transactions on Power Electronics, vol. 17, No. 6, Nov. 2002, pp. 1080-1088.
Villeneuve, Pierre R. et al., "Microcavities in Photonic Crystals: Mode Symmetry, Tunability, and Coupling Efficiency", Physical Review B, vol. 54, No. 11, Sep. 15, 1996, pp. 7837-7842.

(56) References Cited

OTHER PUBLICATIONS

"Next Little Thing 2010 Electricity without wires", CNN Money (See money.cnn.com/galleries/2009/smallbusiness/0911/gallery.next_little_thing_2010.smb/) (dated Nov. 30, 2009).

Ahmadian, M. et al., "Miniature Transmitter for Implantable Micro Systems", *Proceedings of the 25th Annual International Conference of the IEEE EMBS Cancun, Mexico*, pp. 3028-3031 (Sep. 17-21, 2003).

Borenstein, S., "Man tries wirelessly boosting batteries", AP Science Writer, Boston.com, (See http://www.boston.com/business/technology/articles/2006/11/15/man_tries_wirelessly_b . . . ) (Nov. 15, 2006).

Budhia, M. et al.,"Development of a Single-Sided Flux Magnetic Coupler for Electric Vehicle IPT", *IEEE Transactions on Industrial Electronics*, vol. 60:318-328 (Jan. 2013).

Eisenberg, Anne, "Automatic Recharging, From a Distance", The New York Times, (see www.nytimes.com/2012/03/11/business/built-in-wireless-chargeing-for-electronic-devices.html?_r=0) (published on Mar. 10, 2012).

Fan, Shanhui et al., "Rate-Equation Analysis of Output Efficiency and Modulation Rate of Photonic-Crystal Light-Emitting Diodes", IEEE Journal of Quantum Electronics, vol. 36(10):1123-1130 (Oct. 2000).

Ferris, David, "How Wireless Charging Will Make Life Simpler (and Greener)", Forbes (See forbes.com/sites/davidferris/2012/07/24/how-wireless-charging-will-make-life-simpler-and-greener/print/) (dated Jul. 24, 2012).

Finkenzeller, Klaus, "RFID Handbook—Fundamentals and Applications in Contactless Smart Cards", Nikkan Kohgyo-sya, Kanno Taihei, first version, pp. 32-37, 253 (Aug. 21, 2001).

Finkenzeller, Klaus, "RFID Handbook (2nd Edition)", The Nikkan Kogyo Shimbun, Ltd., pp. 19, 20, 38, 39, 43, 44, 62, 63, 67, 68, 87, 88, 291, 292 (Published on May 31, 2004).

Ho, S. L. et al., "A Comparative Study Between Novel Witricity and Traditional Inductive Magnetic Coupling in Wireless Charging", IEEE Transactions on Magnetics, vol. 47(5):1522-1525 (May 2011).

Moskvitch, Katia, "Wireless charging—the future for electric cars?", BBC News Technology (See www.bbc.co.uk/news/technology-14183409) (dated Jul. 21, 2011).

Schneider, D. "A Critical Look at Wireless Power", IEEE Spectrum, pp. 35-39 (May 2010).

Stewart, W., "The Power to Set you Free", Science, vol. 317:55-56 (Jul. 6, 2007).

Yates, David C. et al., "Optimal Transmission Frequency for Ultralow-Power Short-Range Radio Links", IEEE Transactions on Circuits and Systems—1, Regular Papers, vol. 51:1405-1413 (Jul. 2004).

Ziaie, Babak et al., "A Low-Power Miniature Transmitter Using A Low-Loss Silicon Platform for Biotelemetry", *Proceedings—19th International Conference IEEE/EMBS*, pp. 2221-2224, (Oct.30-Nov. 2, 1997) 4 pages.

\* cited by examiner

RESONATOR FINE TUNING

BACKGROUND

1. Field

This disclosure relates to wireless energy transfer and tuning of resonators to accomplish such transfer.

2. Description of the Related Art

Energy or power may be transferred wirelessly using a variety of known radiative, or far-field, and non-radiative, or near-field, techniques as detailed, for example, in commonly owned U.S. patent application Ser. No. 12/613,686 published on May 6, 2010 as US 2010/010909445 and entitled "Wireless Energy Transfer Systems," U.S. patent application Ser. No. 12/860,375 published on Dec. 9, 2010 as 2010/0308939 and entitled "Integrated Resonator-Shield Structures," U.S. patent application Ser. No. 13/222,915 published on Mar. 15, 2012 as 2012/0062345 and entitled "Low Resistance Electrical Conductor," U.S. patent application Ser. No. 13/283,811 published on Oct. 4, 2012 as 2012/0248981 and entitled "Multi-Resonator Wireless Energy Transfer for Lighting," the contents of which are incorporated by reference.

Magnetic resonators may need to be tuned to achieve desired and/or specified performance metrics. To achieve the desired or specified performance metrics for wireless energy transfer, resonators' parameters may need to be within a specific range. For example, in some embodiments a resonator resonant frequency may need to be within a range of the system resonant frequency for example. In other embodiments the resonator may need to be impedance matched to an amplifier, rectifier or other circuitry.

Components used to build and assemble magnetic resonators and power and control circuitry may be specified within a range of tolerances or variability in their component values. Components such as capacitors, inductors, circuit boards, oscillators, resonator coils, transistors, diodes, switches, and the like, may have a rated and/or specified nominal value, but may actually have a value different than the nominal value. In some embodiments for example, variations in the inductance of a resonator coil, or variations in the capacitance of capacitors may result in actual resonant frequencies that are different than the intended and/or designed resonant frequency of the resonator. In other embodiments, variations in inductance of the coil or variations in the capacitance of capacitors may affect the impedance matching between amplifiers, rectifiers, resonators, or any of the circuits. In some embodiments of resonators, the parameters of the resonators may be perturbed by objects in the environment around the resonators.

There are thus many ways in which the frequency and/or the impedance matching of the resonator may be outside of the desired or optimum range due to environmental, manufacturing, operating, and the like, uncertainties. What is needed is a simple and way to tune the resonator parameters to compensate for environment perturbations, manufacturing uncertainty, component variability, and the like.

SUMMARY

A wireless energy transfer system may comprise a resonator coil and a tile. The tile may comprise magnetic material, or electrically conducting material such as copper, or a combination of magnetic material and electrically conducting material. In one aspect, at least one tile of material may be positioned on or near a portion of the resonator coil and the position of the tile of material may be used to change the inductance of the resonator coil. At least one tile of material may be sized to have a desired impact on the inductance. At least one tile of material may be sized to change the inductance by approximately 0.1 μH or more. At least one tile of material may be attached to the coil with tape, adhesives, and/or other fastening methods. The tiles may be movable and may have a common geometric or an irregular shape and may be movable relative to the position of the resonator coil to change the inductance of the resonator. The movement of at least one tile relative to the resonator coil may be adjusted by a person, and/or manually, or it may be adjusted via a mechanical or electromechanical control apparatus, and the tuning of the inductance of the resonator coil may be performed automatically.

In another aspect, a magnetic resonator may be tuned using the positioning of at least one tile. In the method, the parameters of a resonator may be measured and the position of at least one tile may be changed near the resonator. The change in positioning may be adjusted to change the portion of the resonator coil that is covered by the at least one tile material. The measured parameters of the resonator may include the inductance of the resonator coil, the resonant frequency of the resonator, and the impedance of the resonator. The positioning may be performed using a microcontroller or manually by a user.

In accordance with an exemplary and non-limiting embodiment, a tunable resonator assembly comprises a resonator coil having an inductance, and a tile residing at a position relative to the resonator coil the position selected to produce a desired change in the inductance of the resonator coil.

In accordance with another exemplary and non-limiting embodiment, a method for tuning a magnetic resonator comprises measuring a parameter of a resonator comprising a resonator coil, positioning at least one tile to cover an area of the resonator coil and changing the area covered by the at least one tile to change the parameter of the resonator to a desired value.

DETAILED DESCRIPTION

Figure 1:
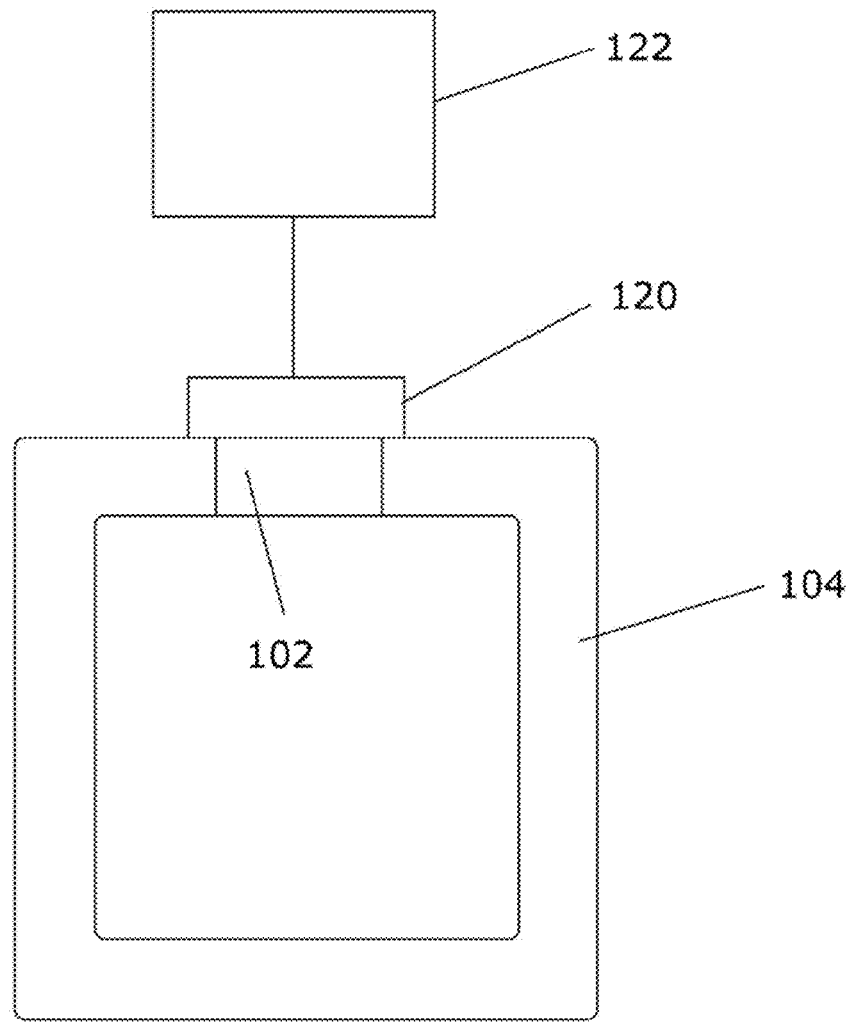
FIG. 1 is a block diagram of a system according to an exemplary and non-limiting embodiment.

Magnetic resonators may need to be tuned to achieve desired and/or specified performance metrics. To achieve the desired or specified performance metrics for wireless energy transfer, resonators' parameters may need to be within a specific parameter range. For example, parameters such as the resonant frequency of a magnetic resonator may need to be matched to the wireless energy transfer system resonant frequency. In accordance with some exemplary embodiments a resonator resonant frequency may need to be within approximately 5% of a system resonant frequency and/or within approximately 5 kHz of a fixed frequency such as 145 kHz, 250 kHz, 6.78 MHz and the like. In other exemplary embodiments, an amplifier, rectifier, source electronic circuit, device electronic circuit, matching network, power and control circuitry, and the like may be impedance matched to the impedance of a resonator or resonator coil. Impedance matching may be used to allow an amplifier, a source electronic circuit, a matching network, a power and control circuit, and the like, to more efficiently drive a source resonator coil or for a rectifier, device electronic circuit, impedance matching network, power and control circuitry, and the like, to more efficiently extract energy from a device resonator coil.

Components used to build and assemble magnetic resonators and power and control circuitry may be specified within a range of tolerances or variability in their component values. Components such as capacitors, inductors, circuit boards, oscillators, resonator coils, transistors, diodes, switches, and the like, may have a rated and/or specified nominal value, but may actually have a value different than the nominal value, but within a specified range or tolerance of that nominal value. In accordance with some exemplary embodiments, the variability of a part may be +−1%, +−2%, +−5%, +−15%, and the like of its nominal value. A capacitor, for example, with a nominal capacitance rating of 100 pF may in fact have a capacitance value anywhere in the range of 85 pF to 115 pF when the capacitor is specified as having a range or variability of capacitance (or range or tolerance) of +−15%.

A variation in the inductance of the resonator coil, or a variation in the capacitance of the resonator may affect the resonant frequency of the resonator. In other embodiments, a variation in the inductance of the coil or a variation in the capacitance of capacitors may affect the impedance matching between amplifiers, rectifiers, or any of the circuits of a wireless power transfer system coupled to the resonators. Such variations may reduce the efficiency of power delivery to or the extraction from, the resonators. The variability of components may mean that for some applications, the parameters of some manufactured resonators or some manufactured wireless power systems may be outside the desired operating range. Some values of the components may need to be tuned or adjusted during manufacture or after manufacture, or additional components may need to be added or existing components removed to compensate for the variability of components placed as part of the resonator or system production process.

In some instances involving resonators, the parameters of the resonators may be perturbed by objects in the environment around the resonators. In some instances, metal or lossy objects placed around resonators may load or perturb the parameters of the resonators. For example, a metallic object near a resonator coil may affect the resonant frequency of the resonator and shift the frequency outside a desired operating range.

Parameters of magnetic resonators may be adjusted or tuned by adding or removing inductors, capacitors, and the like, from the electronic circuits of the resonators until the desired operating parameters, such as the desired resonant frequency or the desired impedance matching, are reached. Components may be added, subtracted and/or altered using electronically controllable switches to tune the overall circuit parameters. Adjusting the parameters of components such as capacitors and capacitor networks and inductors and inductor networks may require several steps of soldering/de-soldering components, measuring effective circuit parameters and/or system or subsystem operation, and soldering/de-soldering other components until the desired net capacitance and inductance values are achieved. Because the components such as capacitors and/or inductors may each have variability of their individual component values, it may be difficult to predict the number of soldering/de-soldering iterations that will be required to achieve the desired circuit and/or system performance parameters.

It therefore may be desirable to allow a user of a wireless power system to perform some tuning of the system after it has been manufactured, purchased, or installed. In such instances, it may be difficult to predict the exact nature or magnitude of perturbations on a resonator due to its environment and hence a user or a consumer may need to tune the parameters at the location and placement that the resonator will be used. In other instances, a wireless power transfer system may comprise resonators that were designed for one environment but are now being operated in a different environment. In yet other instances, tuning the resonators for operation in the different environment may yield system performance improvements. For some products and applications, tuning of the wireless power system components by soldering or unsoldering components such as individual capacitors or inductors may not be desirable, feasible or practical.

It may further be preferable to tune resonators during manufacture to reduce the effects of component variability as well as tune resonators after manufacture allowing users to tune resonators to compensate for effects due to perturbations from the environment using a method other than adding or changing or removing electrical components in the resonators, inductive coils, matching networks and the like. A method that enables resonator tuning without changing components on a circuit board could enable faster manufacturing speeds, higher manufacturing yields, post-manufacture system improvements, user-tuned systems, system reuse through re-tuning and the like.

As discussed with reference to exemplary and non-limiting embodiments discussed more fully below, magnetic resonators and other components of wireless power transfer systems may be tuned inexpensively and with both coarse and fine precision by locating tiles of materials such as magnetic materials (ferrite) in certain positions in the vicinity of the inductive loops or coils of the magnetic resonators.

With reference to FIG. 1, there is illustrated a block diagram of various components that may function in a cooperative manner to tune various parameters of a resonator coil or coils 104 as described herein. As illustrated, tile 102 is located within proximity to resonator coil 104 in a manner sufficient to achieve a desired tuning of resonator coil 104. Actuator 120 operates to position tile 102 in a desired position about resonator coil 104. As described more fully below in accordance with exemplary embodiments, actuator 120 may linearly translate tile 120 back and forth along a perimeter of resonator coil 104, forwards and backwards towards and away from resonator coil 104 and up and down above and below resonator coil 104. In accordance with other exemplary embodiments, actuator 120 may operate to alter a rotational orientation of tile 120 vis-a-vis resonator coil 104.

In accordance with exemplary and non-limiting embodiments, actuator 120 is communicatively coupled to controller 122. Controller 122 operates to provide actuator 120 with instructions in response to which actuator alters a position of tile 102 with respect to resonator coil 104. Controller 102 may comprise any and all devices, including, but not limited to, mechanical and computing devices, configured to receive inputs indicative of a desired position and orientation of tile 102 and outputting instructions to actuator 120 to achieve such desired positioning of tile 102. In accordance with some exemplary embodiments, controller 122 include a computer-readable storage medium encoded with a set of instructions for directing controller to receive user input, such as via a user interface, and to output corresponding instructions to actuator 120. In accordance with other exemplary embodiments, controller 122 may act in autonomous fashion based, at least in part, upon instructions stored upon and/or accessible to controller 122 to instruct the operation of actuator 120 without direct user input. In such embodiments, controller 122 may receive as input measurements or other feedback indicative of desired attributes of resonator coil 104 as affected by the placement of tile 102.

As used herein, references to "blocks" and/or "tiles" of magnetic materials may be used interchangeably with reference to materials utilized in forming tiles 102 and utilized in tuning the inductance of a resonator or inductor coil 104. The blocks or tiles may be of any shape, weight, size and material. For example, blocks and tiles may also be referred to as "disks", "chunks", "pieces", "segments", "chips", "patches", "sheets", "rods", "cores", "plates", and the like. In addition, different tiles 102 may comprise different types of magnetic materials such as ferrites and materials with commercial specifications including, but not limited to, N95, PC95, N49, NLX8, Finemet, Liqualloy, and any other type of magnetic material. Tiles 102 may comprise Ni, Zn, Mg, Fe, and other materials. Tiles 102 may be placed on the resonator coil 104 or any portion of the resonator coil 104. Tiles 102 may be placed near resonator coil 104 or any portion of resonator coil 104. Tiles 102 may be touching the copper conductor forming the resonator coil 104 or they may be offset from the copper conductor. Tiles 102 may be fixed in position or may be movable. Tuning may be achieved using any combination of materials and placement positions. The placement or movement of any combination of Tiles 102 may be used to achieve discrete or continuous tuning of the inductance of resonator coil 104, permanent or adjustable inductance of resonator coil 104, and coarse or fine tuning of the inductance of resonator coil 104.

In a magnetic resonator, the resonant frequency of the resonator may be in part determined by the inductance value of resonator coil 104. The frequency of the resonator may be adjusted or tuned by adjusting the inductance of resonator coil 104 by placing at least one tile 102 or near resonator coil 104. At least one tile 102 placed on or near resonator coil 104 may increase the effective inductance of resonator coil 104 thereby affecting the resonant frequency of the resonator. The change in inductance of the resonator coil 104 may be variably tuned with tiles 102 by varying the size of the magnetic tiles 102, the tile orientation, the number of tiles 102, the type of magnetic material used to form tiles 102, the thickness of tiles 102, the position of the magnetic tile 102 relative to resonator coil 104, and the like. In accordance with exemplary embodiments, the inductance of resonator coil 104 may be increased by increasing the size of the tile or tiles 102 of magnetic materials and/or by increasing the area of resonator coil 104 covered by the tile or tiles 102 and/or by varying the position of the tile or tiles 102. In accordance with exemplary embodiments, the inductance of resonator coil 104 may be increased by moving tiles 102 or a tile 102 of magnetic material closer to resonator coil 104. Likewise, the inductance of resonator coil 104 may be decreased by reducing the area of resonator coil 104 that is covered by tiles 102 or a tile 102 of magnetic material or by increasing the distance between tiles 102 or tile 102 of magnetic material and the resonator coil 104. In accordance with exemplary embodiments, tiles 102 or pieces of magnetic material may be added or removed from the vicinity of resonator coil 104 to change its inductance.

Figure 2:
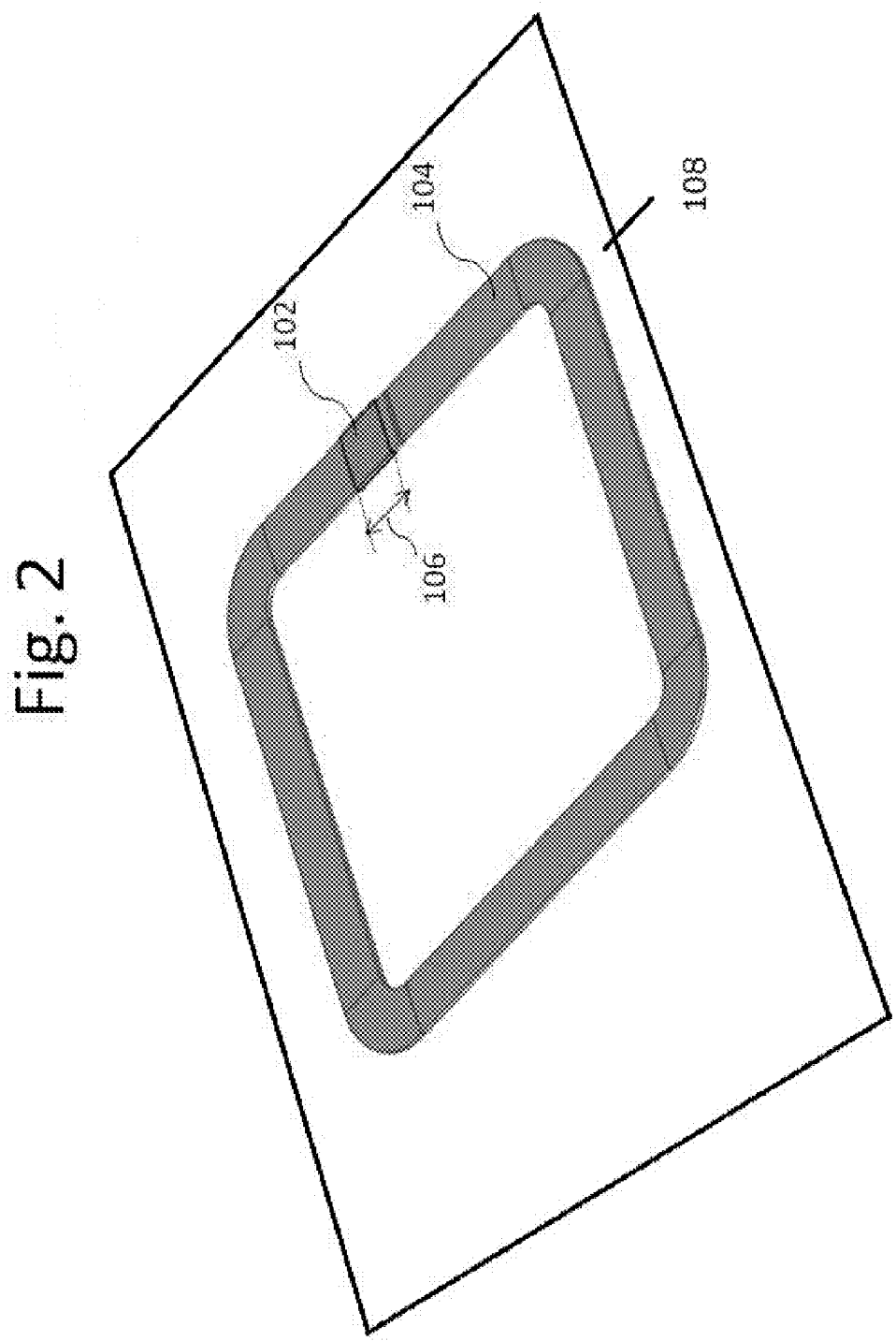
FIG. 2 is an illustration of a resonator coil with a ferrite tuning block according to an exemplary and non-limiting embodiment.

With reference to FIG. 2, there is illustrated an exemplary embodiment of tile 102 and resonator coil 104. For example, a 20 cm by 20 cm resonator coil 104 comprising 10 turns of Litz wire may be connected to a capacitor network (not shown) such that the resonant frequency of the structure is 250 kHz. The resonant frequency of such a structure may be tuned using at least one tile 102 or piece of magnetic material. In this example, a resonator coil 104 in free space may have an inductance, L, of 40.2 µH. The placement of a 1 mm thick tile 102 of magnetic material on top of the resonator coil 104, as shown, may affect the inductance of resonator coil 104. The change in inductance of resonator coil 104 may be varied by changing the tile's length 106 and/or by adding more tiles 102 and/or by adding or removing pieces of tiles 102 and/or by using tiles 102 composed of a different magnetic material, and the like. By changing the length 106 of tile 102 or tiles 102 of magnetic material and/or by repositioning magnetic tile 102 or tiles 102 so that a different amount of resonator coil 104 is covered and/or contacted by tile 102 or tiles 102, the inductance of resonator coil 104 may be tuned and the resonant frequency of the resonator may be tuned.

Figure 3:
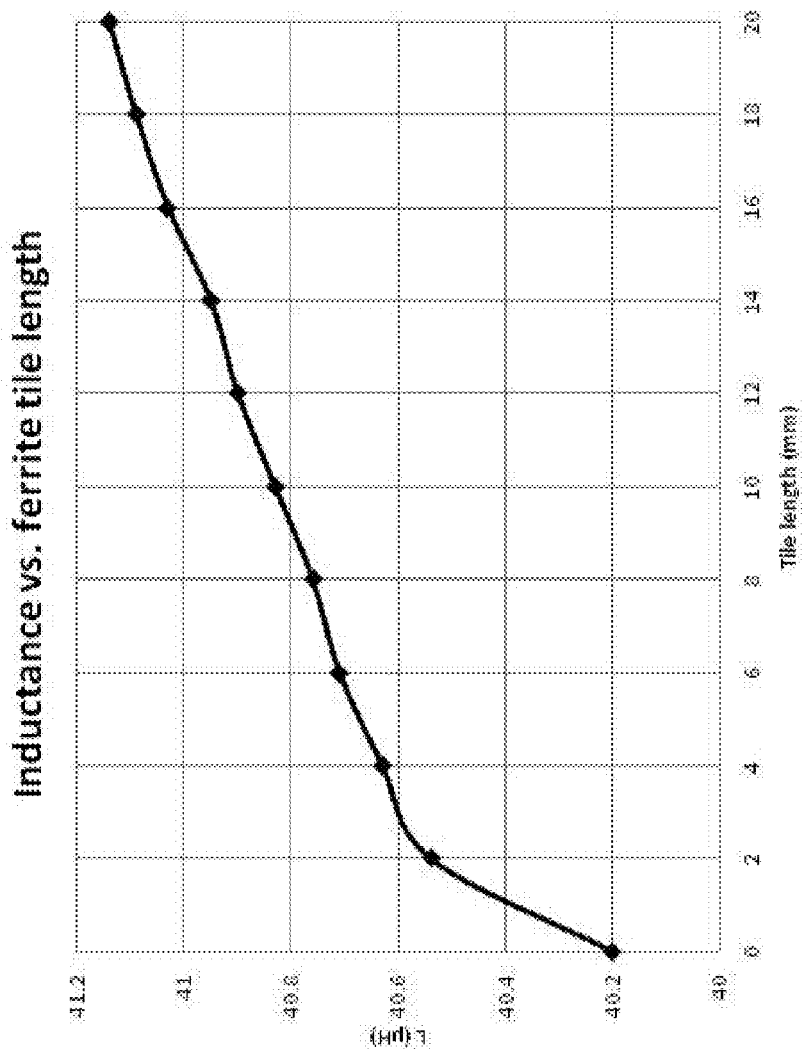
FIG. 3 is a graph showing the effect of a ferrite tile on the inductance of a resonator coil according to an exemplary and non-limiting embodiment.

With reference to FIG. 3, there is illustrated the effect of the length of an exemplary tile 102 of magnetic material on the inductance of an exemplary resonator coil 104. As illustrated, the length 106 of tile 102 (in millimeters) placed on resonator coil 104 is plotted versus the measured inductance of the resonator coil. As the tile length 106 is increased, the inductance of resonator coil 104 increases as well.

In accordance with exemplary embodiments, the change of inductance of a magnetic resonator coil 104 may have a nearly linear relationship with the length of similarly sized and positioned ferrite tiles 102 added to the coil. A known and/or predictable relationship between magnetic tile size (type, shape, position, and the like) and resulting inductance change make it possible to pre-determine the length of tile, or the area of resonator coil 104 that may be covered by a tile 102 of magnetic material, to tune the resonator frequency and/or impedance by a desired amount or to a particular value.

Adding or placing magnetic material, such as tile 102, on resonator coil 104 or near resonator coil 104 may increase the inductance of the coil. In accordance with exemplary embodiments, the desired tuning may be to reduce the inductance of the resonator coil. In such embodiments, a resonator may initially be constructed and tuned with at least one magnetic material tile 102 on or near resonator coil 104 so that inductance may also be reduced by moving, removing or decreasing the size of the at least one tile 102 of magnetic material. In other embodiments, the resonator may be initially constructed and tuned to a lower inductance than the preferred or target inductance of resonator coil 104 thereby ensuring that tuning may require increasing the inductance of resonator coil 104 and thus adding at least one tile 102 of magnetic material.

Figure 4:
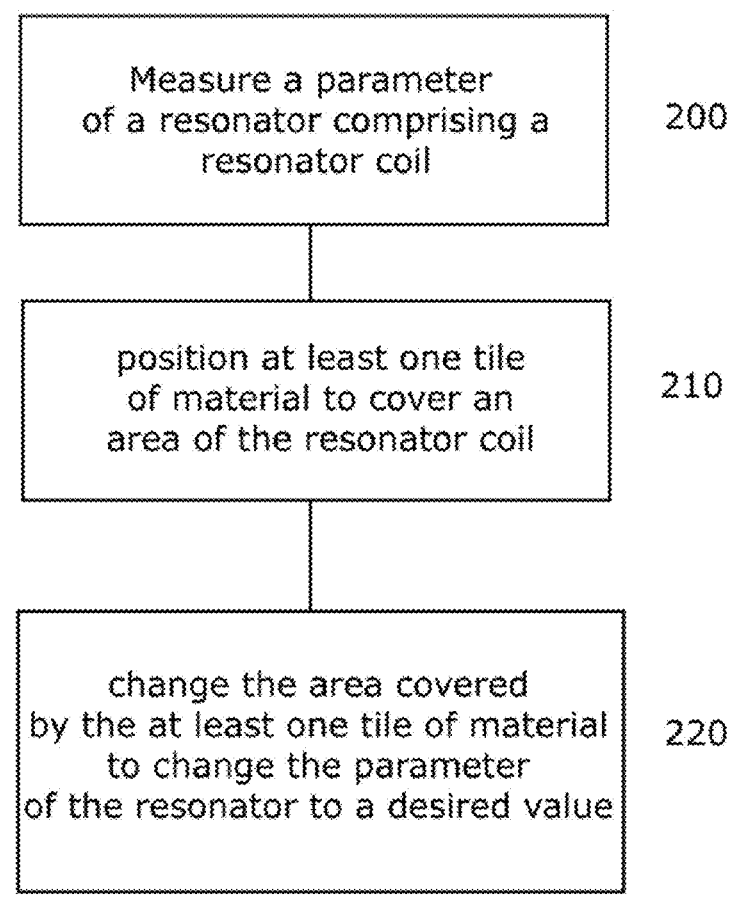
FIG. 4 is a flow diagram of a method according to an exemplary and non-limiting embodiment.

With reference to FIG. 4, there is illustrated an exemplary embodiment of a method for tuning a resonator coil 104 via the purposeful positioning of a tile 102. First, at step 200, a parameter of a resonator comprising a resonator coil 104 is measured. Next, at step 210, at least one tile 102 is positioned to cover an area of the resonator coil 104. Then, at step 220, the area covered by the at least one tile 102 is altered to change the parameter of the resonator to a desired value. Details associated with these steps are described more fully below.

In accordance with exemplary embodiments, tuning of resonator parameters using at least one tile 102 of magnetic material may be performed during the manufacturing of the resonator. For example, the resonant frequency of the resonator may be measured and adjusted by gluing, attaching, sticking, strapping, tying, magnetically attaching, taping, positioning, and the like at least one of various sized tiles 102 of magnetic material to an area of resonator coil 104 or a position sufficiently near resonator coil 104 to achieve a predetermined inductance of resonator coil 104. During manufacture, a resonator or resonator coil 104 may be manufactured using components whose parameter values may have variability or a specified tolerance. After manufacture, parameters of the resonator or resonator coil 104 may be measured and adjusted with the placement of the at least one tile 102 of magnetic material. For example, a machine or an operator may add one or more tiles 102 or increase the effective size of magnetic tiles 102 added to resonator coil 104 if the inductance is measured to be below a desired value.

In accordance with exemplary embodiments, tuning of magnetic resonators and/or wireless power transmission systems may be implemented by a user or a consumer after the resonators and/or systems are manufactured. In accordance with exemplary embodiments, at least one tile 102 of magnetic material may be attached to resonator coil 104 or on the packaging near resonator coil 104. A product with a magnetic resonator may come with a variety of differently sized adhesive tiles 102 of magnetic material that may be attached to resonator coil 104 or the enclosure of the resonator coil. A person or machine performing tuning may try attaching differently sized tiles 102 and/or combinations of tiles 102 until the desired resonant frequency, or wireless energy transfer performance is achieved. In accordance with exemplary embodiments, a resonator housing 108 may use permanent magnet materials, or other magnetic materials, to attract and hold the differently size tiles and/or combinations of tiles to the desired position on or near the resonator coil. In embodiments, there are many ways to hold differently sized tiles and/or combinations of differently sized tiles 102 on or near resonator coil 104, either in a temporary or fixed manner, to tune the inductance of magnetic resonator coil 104.

In accordance with exemplary and non-limiting embodiments a resonator or a package for a resonator or a product may include a slide, dial, switch, knob, and the like that allows a user to directly or indirectly change the area of resonator coil 104 that is covered by a tile 102 of a magnetic material thereby tuning the inductance of the resonator coil.

Figure 5:
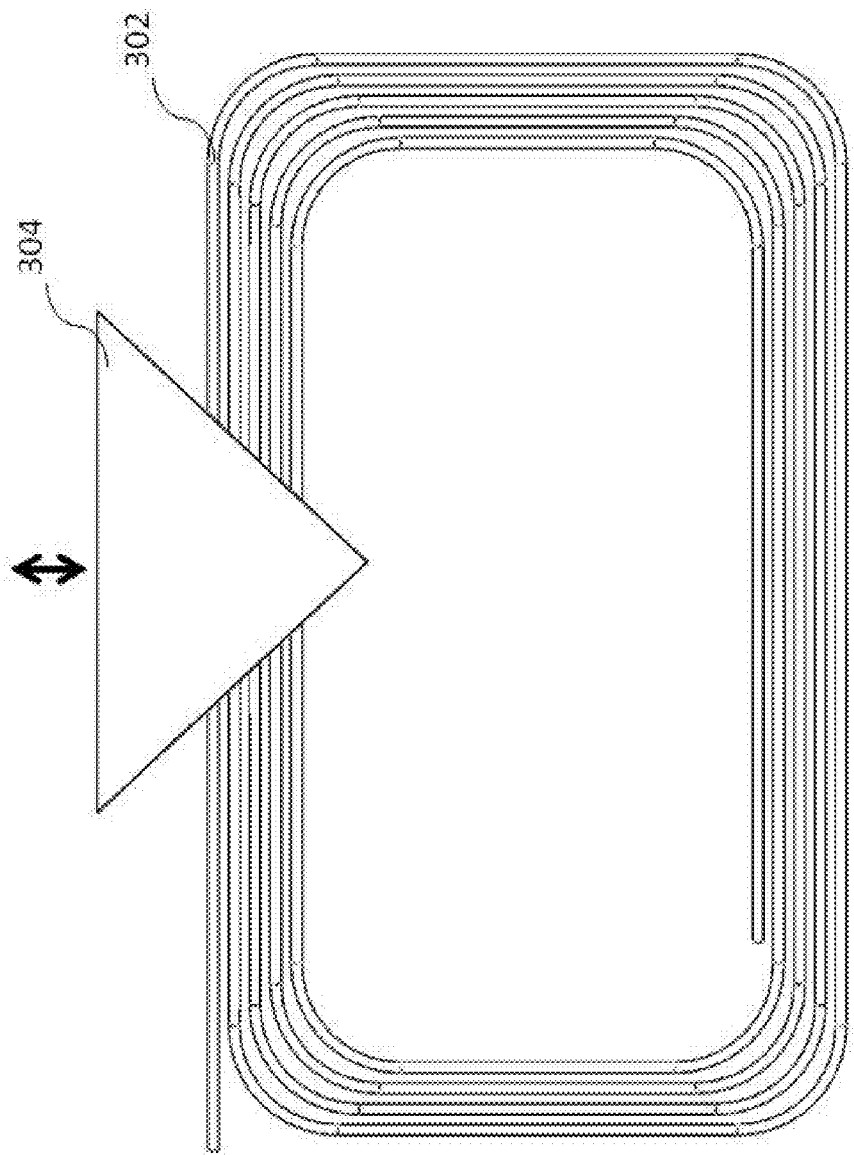
FIG. 5 is a diagram showing a resonator coil with a triangular ferrite tuning block according to an exemplary and non-limiting embodiment.

With reference to FIG. 5, there is illustrated an exemplary embodiment of a configuration of tile 304 for selectively altering the inductance of resonator coil 302. As illustrated, for example, tile 304 may be shaped or oriented such that when tile 304 is rotated, slid, or moved, tile 304 will span or cover a different area of resonator coil 302. In this example, the magnetic tile 304 is shaped as a triangle and positioned partially over the resonator coil 302. Sliding the triangular shaped tile 304 of magnetic material in the direction of the arrow will change the area of resonator coil 302 that is covered by tile 304. The tile 304 of magnetic material may be moved by hand, and/or by a knob or a slider accessible to a user. The magnetic material may be moved by any type of electro-mechanical or automated actuator 120 such as in response to instructions received from controller 122.

Figure 6:
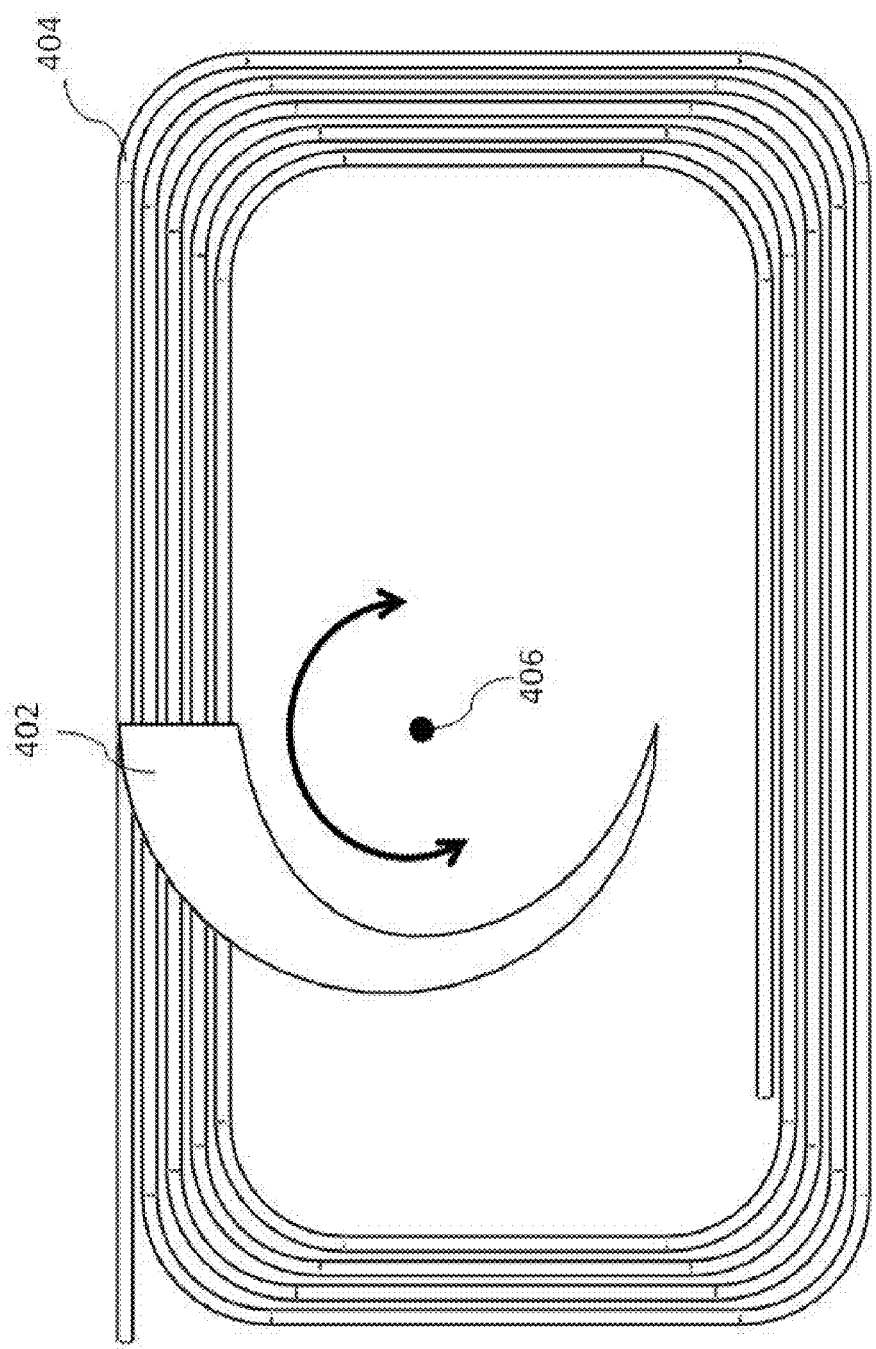
FIG. 6 is a diagram showing a resonator coil with a spiral shaped ferrite tuning block according to an exemplary and non-limiting embodiment.

With reference to FIG. 6, there is illustrated another exemplary and non-limiting embodiment of tile 402 having a curved shape designed to cover a different area of resonator coil 404 when tile 402 is rotated around a central location 406 as indicated by the arrow. In accordance with some exemplary embodiments, the curved tile 402 may be rotated by hand, a knob or, a slider or the like accessible to a user or actuator 120.

As those skilled in the art will appreciate, the tiles 102 may have a variety of different shapes, cutouts, sizes, and the like depending on the type of movement, amount of tuning range desired, and the like. In some exemplary embodiments, the movement of tiles 102 may be directly controlled by a user with an external knob or slider, such as one providing input to controller 122, actuator 120 or in physical communication with tie 102. In other exemplary embodiments, the movement of tile 102 may be controlled electronically by a variety of electromechanical actuators 120 such as servos, motors, piezoelectric materials, electromagnets and the like. In accordance with some exemplary embodiments, the tiles 102 may be continuously moved to sweep the frequency and/or impedance of the magnetic resonator, or the magnetic materials may be moved periodically, intermittently, and/or using a sequence that implements a frequency or impedance hopping scheme.

Figure 7:
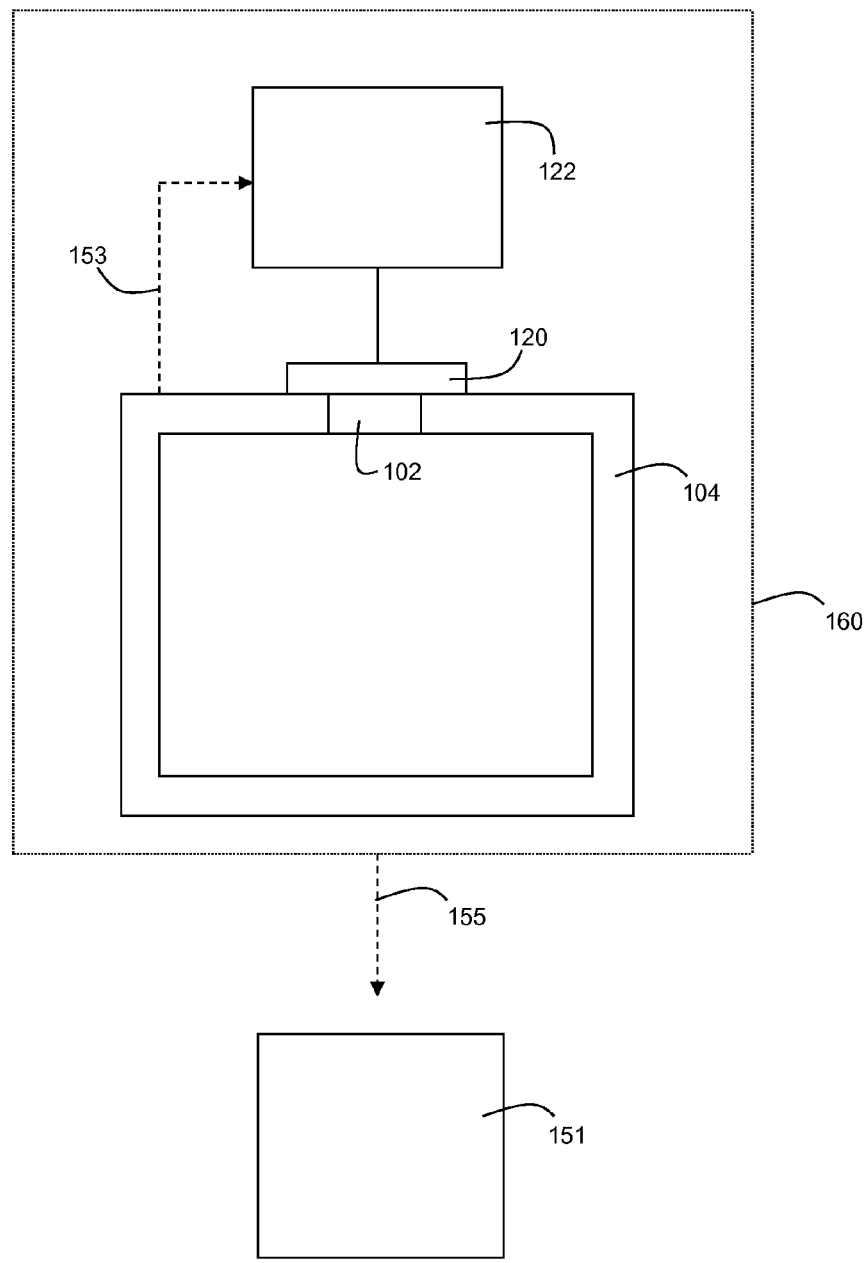
FIG. 7 is a block diagram of an embodiment of a system for wireless power transfer.

The position of the tile 102 of magnetic material may be controlled by an operator, either directly or via interfacing with controller 122, or automatically by power and control circuitry, such as may comprise controller 122 and actuator 120. Power and control circuitry may additionally include components for measuring the parameters of the resonator or the electrical parameters of the resonator during energy transfer and using mechanical or electromechanical actuators 120 or motors to adjust the position of tiles 102 of magnetic material to tune the parameters of magnetic resonator 104. For example, with reference to FIG. 7, when resonator coil 104 of wireless power source 160 is transferring energy (represented schematically by arrow 155) to receiving device 151, controller 122 can receive a measurement feedback signal 153 (represented schematically by arrow 153) carrying information about the parameters of resonator coil 104, which are related to the energy transfer, and can tune the parameters of resonator coil 104 based on the signal. The tiles 102 may thus form part of a feedback circuit or a feedback scheme for controlling magnetic resonators and/or wireless power transmission system performance. Tile 102 may be part of a monitoring method, a communication method, a signaling method and the like utilized in a wireless power transmission system.

In accordance with exemplary and non-limiting embodiments, resonator, such as one comprising resonator coil 104, and/or wireless power transfer system tuning using the position of at least one tile 102 of magnetic material may be performed interactively by a user. For example, the tuning may be performed on a source resonator and the effects of the tuning may be observed on the devices. A device may have a read-out, or an indicator of the power it is receiving, and the power level may vary as the at least one tile 102 of magnetic materials is moved and/or adjusted. A user may adjust the tuning knob that moves the tiles 102 of magnetic material relative to the resonator coil 104 until the power delivered to the device is maximized. As described above, such a knob or other adjusting device may be in physical communication with tile 102 or may be, for example, be a virtual knob or other graphic element comprising a user interface of controller 122 via which the user may adjust the position of tile 102. The tuning of magnetic resonators using tiles 102 may be implemented on any type of magnetic resonator, including but not limited to source resonators, device resonators, repeater resonators, resonators comprising air core inductors, resonators comprising magnetic material core inductors, resonators comprising tunable and/or fixed components such as capacitors, capacitor banks, inductors, self-structures, switches, and the like.

In accordance with exemplary embodiments, tuning using tiles 102 of magnetic material may be used on both source and device resonators. In some embodiments of a wireless energy transfer system only source resonators may have a tuning capability using tiles 102 of magnetic material. In other embodiments of a wireless energy transfer system only the device resonators may have a tuning capability using tiles 102 of magnetic material. In other embodiments of a wireless energy transfer system at least one repeater resonator may have a tuning capability using tiles 102 of magnetic material. In other embodiments of a wireless energy transfer system only one or any combination of resonators may have a tuning capability using tiles 102 of magnetic material In accordance with exemplary embodiments, the effective inductance of resonator coil 104 may also be adjusted by changing the relative distance between resonator coil 104 and at least one tile 102 of magnetic material. The closer tile 102 of magnetic material is to the resonator coil the larger the effective inductance of the coil. In addition to, or instead of adjusting the inductance of the resonator by changing the area of the resonator coil covered by the magnetic material, the inductance of the resonator coil may be adjusted by changing the spacing between the magnetic material and the resonator coil.

In accordance with exemplary embodiments, tiles 102 of electrically conducting materials may be used to tune the inductance of resonator coil 104. Any embodiments, examples, explanations, and the like described herein that include the use of tiles 102 of magnetic material are equally valid and inventive if the tiles 102 comprise good conducting materials in addition to the magnetic materials, or instead of the magnetic materials. Example of good conducting materials include, but are not limited to, copper, silver, aluminum, platinum, gold, conducting paste, gels, inks, paints and the like.

In accordance with various exemplary embodiments tiles 102 may comprise a low loss magnetic material such as ferrite and/or appropriately sized and shaped low loss conductors so as to mitigate any undesired effects of tile 102 on other parameters of the resonator such as lowering its quality factor, for example.

While the invention has been described in connection with certain preferred embodiments, other embodiments will be understood by one of ordinary skill in the art and are intended to fall within the scope of this disclosure, which is to be interpreted in the broadest sense allowable by law. For example, designs, methods, configurations of components, etc. related to transmitting wireless power have been described above along with various specific applications and examples thereof. Those skilled in the art will appreciate where the designs, components, configurations or components described herein can be used in combination, or interchangeably, and that the above description does not limit such interchangeability or combination of components to only that which is described herein.

All documents referenced herein are hereby incorporated by reference.

What is claimed is:

1. A source for transferring power wirelessly to a receiving device, the source comprising:
    a resonator coil having an inductance;
    a tile contacting the resonator coil and movable relative to the resonator coil; and
    a controller configured so that during wireless power transfer from the source to the receiving device, the controller:
        receives a feedback signal comprising information about the wireless power transfer between the source and the receiving device; and
        adjusts a position of the tile relative to the resonator coil based on the feedback signal to change the inductance of the resonator coil, thereby regulating the wireless power transfer.

2. The source of claim 1, wherein the tile comprises a magnetic material.

3. The source of claim 1, wherein the tile comprises an electrical conductor.

4. The source of claim 1, wherein the tile comprises a magnetic material and an electrical conductor.

5. The source of claim 1, wherein the tile is sized to tune the inductance of the resonator coil by at least 0.1 µH when the position of the tile is adjusted relative to the resonator coil.

6. The source of claim 1, wherein the tile comprises an adhesive.

7. The source of claim 1, wherein the tile is shaped such that when the tile is moved in a linear direction, an area of the resonator coil covered by the tile changes.

8. The source of claim 7, wherein the tile is triangular shaped.

9. The source of claim 1, wherein the tile is shaped such that when the tile is rotated, an area of the resonator coil covered by the tile changes.

10. The source of claim 1, wherein the controller is configured to adjust a separation between the tile and the resonator coil.

11. The source of claim 1, wherein the controller is configured to adjust a relative angle between the tile and the resonator coil.

12. The source of claim 1, further comprising a mechanical means coupled to the controller configured to change the position and an orientation of the tile.

13. The source of claim 1, further comprising an electromechanical means coupled to the controller and configured to change the position and an orientation of the tile.

14. A method of wireless power transfer from a source to a receiving device, the method comprising:
    receiving a feedback signal comprising information about wireless power transfer between the source and the receiving device; and
    regulating the wireless power transfer between the source and the receiving device by adjusting a position of at least one tile that contacts a resonator coil of the source based on the feedback signal,
    wherein adjusting the position of the at least one tile changes an operating parameter of the source.

15. The method of claim 14, wherein the tile comprises a material selected from a group consisting of magnetic material, conducting material, and conducting and magnetic material.

16. The method of claim 14, wherein the operating parameter comprises an inductance of the resonator coil.

17. The method of claim 14, wherein the operating parameter comprises a resonant frequency of the resonator coil.

18. The method of claim 14, wherein the operating parameter comprises an impedance of the resonator coil.

19. The method of claim 14, further comprising adjusting the position of the at least one tile using a controller.

20. The method of claim 14, further comprising manually adjusting the position of the at least one tile.

* * * * *